US011191185B2

(12) United States Patent
Chopra et al.

(10) Patent No.: US 11,191,185 B2
(45) Date of Patent: *Nov. 30, 2021

(54) LIQUID COOLING DISTRIBUTION IN A MODULAR ELECTRONIC SYSTEM

(71) Applicant: CISCO TECHNOLOGY, INC., San Jose, CA (US)

(72) Inventors: Rakesh Chopra, Menlo Park, CA (US); Mandy Hin Lam, Fremont, CA (US); M. Baris Dogruoz, Santa Clara, CA (US); Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/749,254

(22) Filed: Jan. 22, 2020

(65) Prior Publication Data

US 2020/0163251 A1 May 21, 2020

Related U.S. Application Data

(63) Continuation-in-part of application No. 16/131,629, filed on Sep. 14, 2018, now Pat. No. 10,582,639.

(51) Int. Cl.
*H05K 7/20* (2006.01)

(52) U.S. Cl.
CPC ....... *H05K 7/20281* (2013.01); *H05K 7/2079* (2013.01); *H05K 7/20272* (2013.01); *H05K 7/20772* (2013.01); *H05K 7/20781* (2013.01)

(58) Field of Classification Search
CPC ...... G06F 1/20; G06F 2200/201; G06F 1/206; G06F 1/187; G06F 1/183; H01L 2924/00; H01L 23/473; H05K 7/20809; H05K 7/20327; H05K 7/203; H05K 7/20818; H05K 7/20736; H05K 7/20509; H05K 7/20254; H05K 7/20218; H05K 7/20281; H05K 7/208; H05K 7/20927; H05K 7/20745; H05K 7/2079; H05K 7/20836; H05K 7/20; H05K 7/20336; H05K 7/20381; H05K 7/20781; H05K 1/0272; H05K 2201/064; F28D 15/00; F28D 15/02; F28D 2015/0216; F28D 2021/0031; F28F 3/12; F28F 9/26; F28F 13/02; F28F 13/06;

(Continued)

(56) References Cited

U.S. PATENT DOCUMENTS 5,816,252 A * 10/1998 Faries, Jr. ............. A61F 7/0241
128/849
6,855,881 B2 2/2005 Khoshnood
8,276,397 B1 10/2012 Carlson (Continued)

FOREIGN PATENT DOCUMENTS

CN 201689347 U 12/2010

*Primary Examiner* — Mandeep S Buttar

(57) ABSTRACT

In one embodiment, a network communications device includes a chassis, a plurality of modules removably inserted into a plurality of slots in the chassis, at least a portion of the modules each comprising a connector for receiving coolant for cooling components on the module, a controller for controlling coolant distribution to the modules, and a leak detection system for identifying a leak of the coolant and transmitting an indication of the leak to the controller.

17 Claims, 26 Drawing Sheets

(58) Field of Classification Search
CPC ............. F28F 2260/02; H01M 10/613; H01M 2/1077; H01M 10/6567
USPC .... 361/679.47, 679.46, 679.48, 679.53, 699, 361/622, 701, 704, 752, 796; 165/104.19, 165/104.33, 80.4
See application file for complete search history.

(56) References Cited

U.S. PATENT DOCUMENTS

| | | | |
|---|---|---|---|
| 8,700,923 B2 | 4/2014 | Fung | |
| 8,842,430 B2 | 9/2014 | Hellriegel | |
| 9,273,906 B2 | 3/2016 | Goth | |
| 9,510,479 B2 | 11/2016 | Vos | |
| 9,693,244 B2 | 6/2017 | Maruhashi | |
| 10,638,645 B1* | 4/2020 | Moen | H05K 7/20772 |
| 2004/0080618 A1* | 4/2004 | Norris | G08B 13/19602 |
| | | | 348/207.1 |
| 2005/0207116 A1 | 9/2005 | Yatskov | |
| 2008/0317024 A1 | 12/2008 | Rygh | |
| 2010/0014248 A1* | 1/2010 | Boyden | H05K 7/20563 |
| | | | 361/695 |
| 2012/0064745 A1 | 3/2012 | Ottliczky | |
| 2012/0079872 A1* | 4/2012 | Schaefer | G01M 3/2807 |
| | | | 73/40.5 A |
| 2012/0120596 A1 | 5/2012 | Bechtolsheim | |
| 2012/0201089 A1 | 8/2012 | Barth | |
| 2012/0327597 A1* | 12/2012 | Liu | H05K 7/20736 |
| | | | 361/692 |
| 2013/0077923 A1 | 3/2013 | Weem | |
| 2014/0260571 A1* | 9/2014 | Stevens | G01N 21/81 |
| | | | 73/73 |
| 2015/0153122 A1* | 6/2015 | Stone | F01P 11/14 |
| | | | 134/34 |
| 2016/0262288 A1 | 9/2016 | Chainer | |
| 2017/0049009 A1* | 2/2017 | Steinke | H05K 7/20772 |
| 2019/0150326 A1* | 5/2019 | Gao | H05K 7/20172 |
| | | | 361/679.47 |
| 2019/0292040 A1* | 9/2019 | Fieglein | G06T 7/0002 |

* cited by examiner

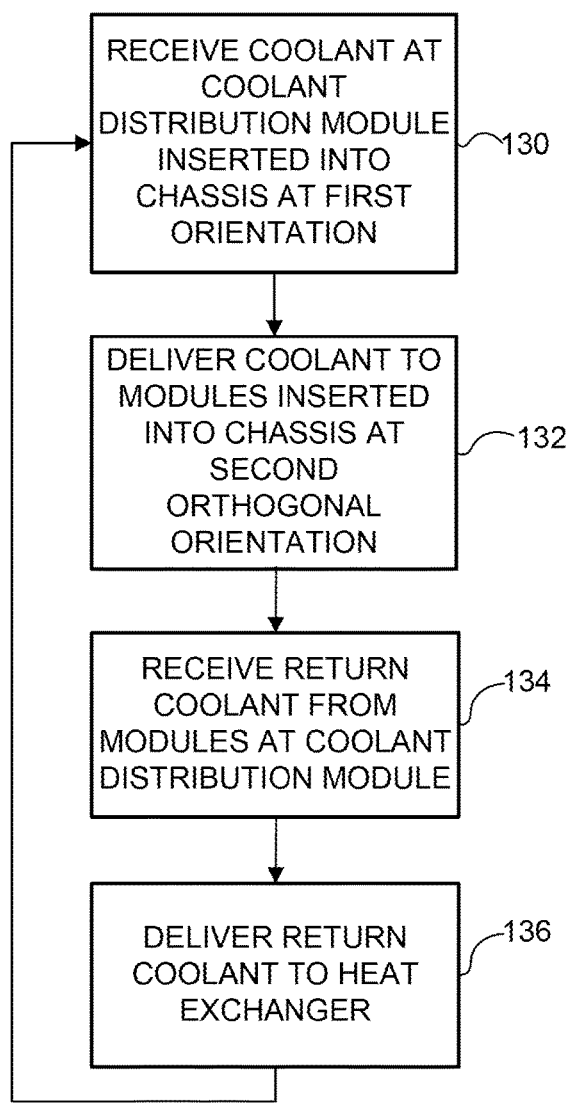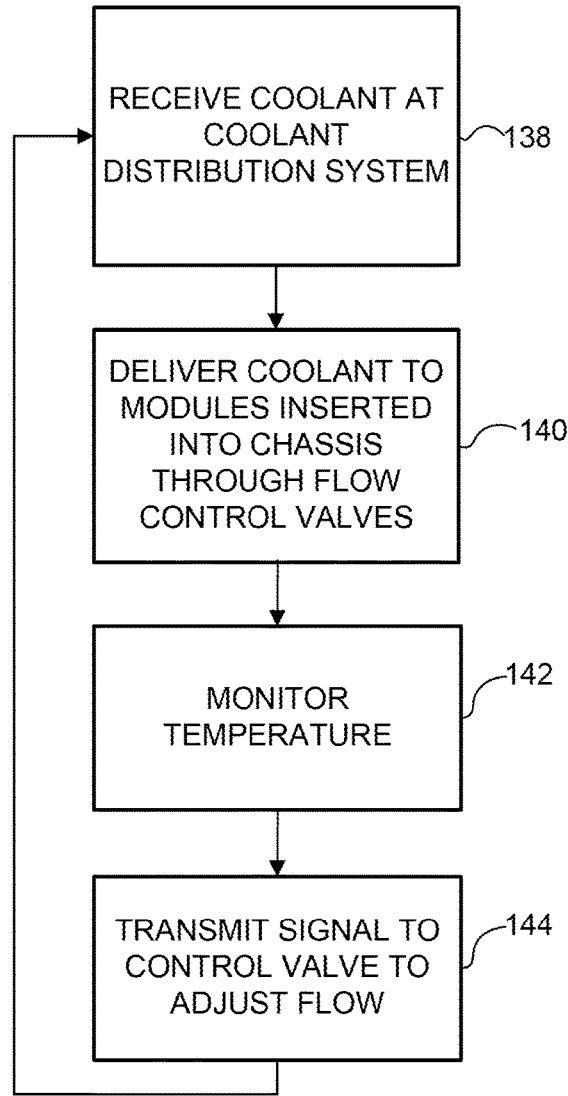
FIGURE 21A
FIGURE 21B

LIQUID COOLING DISTRIBUTION IN A MODULAR ELECTRONIC SYSTEM

STATEMENT OF RELATED APPLICATIONS

The present application is a continuation-in-part of U.S. patent application Ser. No. 16/131,629, entitled LIQUID COOLING DISTRIBUTION IN A MODULAR ELECTRONIC SYSTEM, filed on Sep. 14, 2018 Ser. No. 16/131,629, which is incorporated herein by reference in its entirety.

TECHNICAL FIELD

The present disclosure relates generally to modular electronic systems, and more particularly, liquid cooling distribution in a modular electronic system.

BACKGROUND

Over the past several years, there has been a tremendous increase in the need for higher performance communications networks. Increased performance requirements have led to an increase in energy use resulting in greater heat dissipation from components. As power use increases, traditional air cooling may no longer be adequate to cool network devices and liquid cooling may be needed.

Modular electronic systems are designed to provide flexibility to configure systems as per user needs. These systems include multiple slots to accommodate a variety of modules (e.g., line cards, fabric cards, and the like). Orthogonal systems, which have cards inserted both horizontally and vertically, may present additional challenges for liquid cooling because cards often connect to the front and back of the system.

BRIEF DESCRIPTION OF THE DRAWINGS

FIG. 21A is a flowchart illustrating an overview of a process for coolant distribution in an orthogonal modular electronic system, in accordance with one embodiment.

FIG. 21B is a flowchart illustrating an overview of a process for distributing coolant through flow control valves, in accordance with one embodiment.

Corresponding reference characters indicate corresponding parts throughout the several views of the drawings.

DESCRIPTION OF EXAMPLE EMBODIMENTS

Overview

Figure 1:
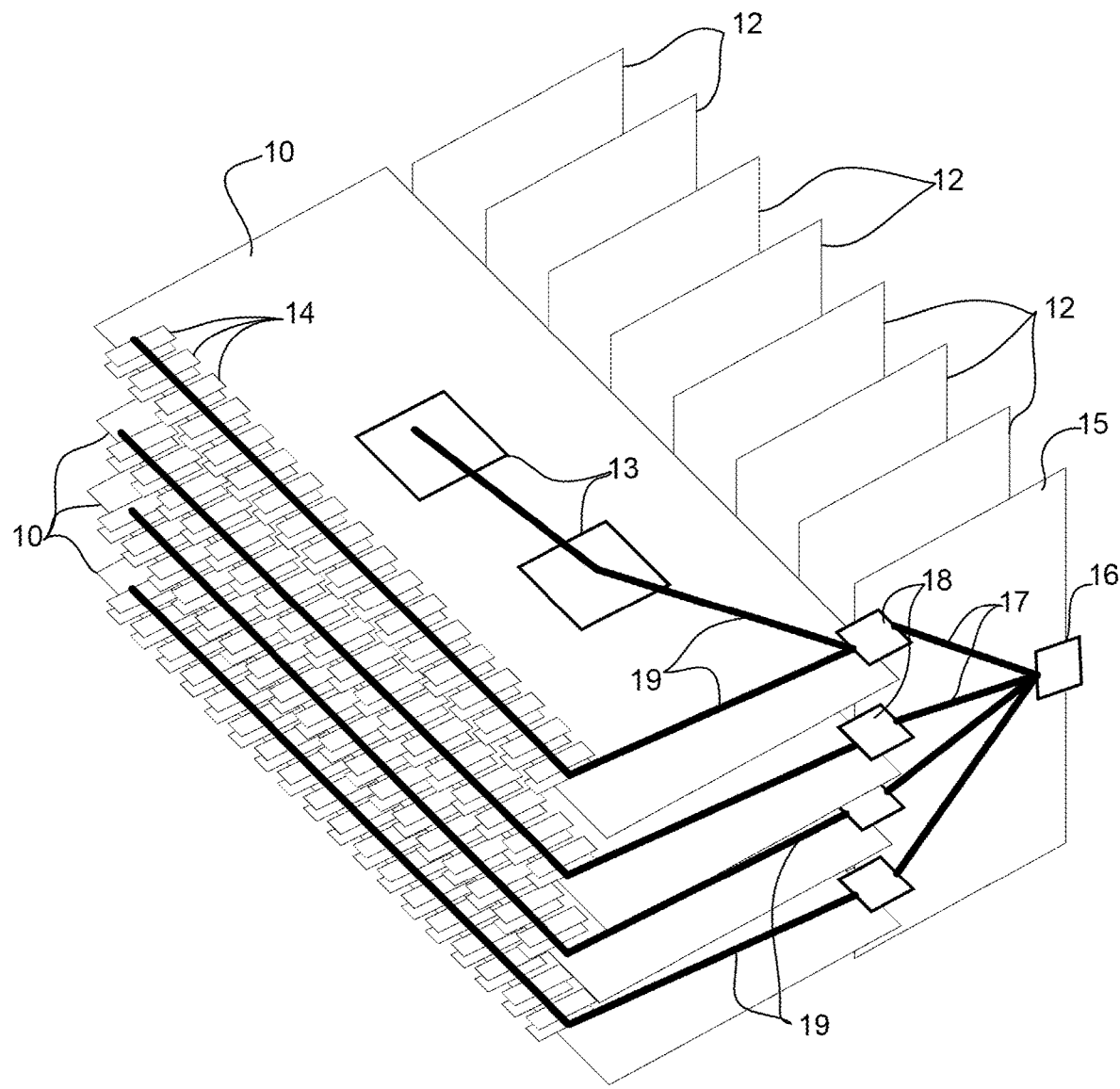
FIG. 1 illustrates liquid cooling distribution for horizontal modules in an orthogonal system, in accordance with one embodiment.

In one embodiment, an apparatus generally comprises a chassis comprising a plurality of slots for receiving a plurality of modules, a first group of the modules received in a first orientation and a second group of the modules received in a second orientation orthogonal to the first orientation, and a coolant distribution module inserted into one of the plurality of slots in the first orientation for distributing coolant to at least one of the modules in the second group of the modules, the coolant distribution module comprising a first connector for receiving the coolant and a second connector for mating with the module in the second group of the modules receiving the coolant.

In one or more embodiments, the apparatus comprises a leak detection system for indicating a leak of the coolant.

In one or more embodiments the leak detection system comprises a pressure sensor for detecting a change in pressure in a coolant loop.

In one or more embodiments, the leak detection system comprises a velocity sensor for detecting a change in speed of the coolant in a coolant loop.

In one or more embodiments, the leak detection system comprises a camera for use in identifying the leak.

In one or more embodiments, the leak detection system comprises a tray for collecting the coolant from the leak, the tray comprising a material configured to change color upon contact with the coolant.

In one or more embodiments, the leak detection system comprises a weight sensor for use in identifying collection of leaked coolant.

In one or more embodiments, the apparatus includes a controller for receiving an indication of the leak from the leak detection system and transmitting a signal to a control valve to shut off flow of the coolant.

In one or more embodiments, the apparatus includes a second coolant distribution module inserted into one of the plurality of slots in the second orientation for distributing coolant to at least one of the modules in the first group of the modules, and a control system for controlling delivery of the coolant to the first and second coolant distribution modules.

In another embodiment, a network communications device generally comprises a chassis, a plurality of modules removably inserted into a plurality of slots in the chassis, at least a portion of the modules each comprising a connector for receiving coolant for cooling components on the module, a controller for controlling coolant distribution to the modules, and a leak detection system for identifying a leak of the coolant and transmitting an indication of the leak to the controller.

In yet another embodiment, a method generally comprises receiving coolant at a coolant distribution system in a chassis of a network communications device, delivering coolant to a plurality of modules inserted into the chassis, wherein the coolant is delivered to a first group of the modules with a first flow control valve in a first cooling loop and the coolant is delivered to a second group of the modules with a second flow control valve in a second cooling loop, monitoring a temperature in the first and second cooling loops, and transmitting a signal to one of the first and second flow control valves to modify a flow of the coolant.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Network devices are moving away from traditional midplane designs to orthogonal based systems, which may include, for example, line cards inserted horizontally and fabric cards inserted vertically, leading to orthogonal orientation of the line cards and fabric cards, with each fabric card connected to all line cards and all line cards connected to all fabric cards. This direct attachment eliminates the need for a chassis midplane.

As power draw on processors and system components increases, traditional air cooling may no longer be adequate and liquid cooling may be needed. Liquid cooling provides improved efficiency and superior thermal properties over air cooling and may be essential for cooling higher power processers needed to meet future bandwidth requirements. Orthogonal based systems may pose additional challenges for implementation of liquid cooling due to circuit boards with high power components connected to the front and back of the system. Additional challenges are also presented if retrofit of air cooled systems is desired.

The embodiments described herein provide a system that may operate with liquid cooling (or liquid cooling and air cooling) through the use of one or more coolant distribution modules inserted in an orthogonal based modular electronic system. The liquid cooling may be distributed for use by one or more modules inserted horizontally, vertically, or both horizontally and vertically. One or more embodiments may support exchangeable air and liquid cooled modules in a new chassis design or adapt air cooled systems to implement liquid cooling for high heat density electronics, without the need to manage individual liquid distribution (plumbing) connections at each module. Systems configured for air cooling may be modified to support centralized liquid cooling distribution systems in accordance with one or more embodiments. For example, the embodiments described herein may be used to convert an air cooled chassis to a liquid cooled chassis, without requiring external plumbing connections for each field replaceable unit. In one or more embodiments, liquid cooling distribution may be provided through replacement of one or more field replaceable units in an existing air cooled chassis and the system may use both air cooling and liquid cooling. Thus, the embodiments allow both liquid cooled modules and air cooled modules to be used together in one chassis. As described in detail below, a horizontal adapter card (coolant distribution module) may be used to provide liquid cooling to vertical modules (e.g., fabric cards), a vertical adapter card (coolant distribution module) may be used to provide liquid cooling to horizontal modules (e.g., line cards), or both a horizontal adapter card and vertical adapter card may be used to provide liquid cooling to horizontal and vertical modules. The centralized coolant distribution eliminates the need to manually connect and disconnect plumbing for OIR (Online Installation and Removal) of field replaceable units (e.g., line cards, fabric cards). In one or more embodiments, a minimal amount of external plumbing connections may be used with a central coolant distribution system that manages individual field replaceable units. In one or more other embodiments a self-contained cooling system may be used to off-load thermal load from the line cards or fabric cards without any external plumbing.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data over one or more networks. One or more of the network devices may comprise a modular electronic system comprising a liquid cooling distribution system described herein. The network device may include one or more processor, memory, and network interfaces, with one or more of these components located on a module (e.g., line card, fabric card) removably inserted into the network device.

It is to be understood that the term "module" as used herein may refer to any modular electronic component, field replaceable unit, line card, fabric card, service card, or other card, element, or component configured for insertion and removal from a chassis of a modular network device. In the examples described herein, line cards are inserted horizontally into the chassis and fabric cards are inserted vertically (orthogonal to the line cards) in the chassis, however, any type of module (e.g., line card, fabric card, or other card) may be positioned orthogonal to any other type of module. The term "orthogonal" as used herein generally describes a relationship between two geometric constructions in which the two geometric constructions are disposed at substantially 90° degrees to one another. The terms horizontal and vertical as used herein are relative terms and if the chassis is mounted on its side, the horizontal modules would be mounted vertically and the vertical modules would be mounted horizontally.

Also, it is to be understood that the term "liquid cooling" as used herein may refer to any coolant fluid (liquid, gas, or multi-phase) as to distinguish it from "air cooling" provided by conventional fans. The coolant may comprise, for example, liquid (e.g., water, water/glycol (e.g., 80% water, 20% glycol)), electrically non-conductive fluids/liquids, gaseous refrigerants, or mixed-phase coolants (partially changing from liquid to gas along the coolant loop). The coolant may also be compressed gas that is delivered to cool the modules and then released to an open environment, thereby eliminating the need for a return line. The coolant may be provided by a source of low-temperature supply coolant that is sent through distribution plumbing, as described below, and routed through elements inside the network device (e.g., components on a module (line card, fabric card, or other field replaceable unit)). Warmed coolant may be aggregated through a return manifold where it passes through a heat exchanger to remove the heat from the coolant loop to an external cooling plant, with the cycle then repeating. The heat exchanger may be a liquid-liquid heat exchanger or a liquid-air heat exchanger, with fans provided to expel the waste heat to the atmosphere, for example. The heat exchanger may be located within the network device, adjacent to the network device, or remote from the network device at a central location that services any number of network devices. For example, the heat exchanger may be located within the same rack as the network device or the system may be connected to a building wide liquid cooling distribution system. In one or more embodiments, the heat exchanger may comprise two isolated fluid channels. If the coolant flow stops from one channel, the other channel may supply enough coolant to keep the critical components operational. Isolation may be provided to prevent loss of pressure in one fluid loop from also affecting the pressure in the redundant loop.

Pumps for coolant distribution may be located external to the network device or within the modular electronic system. Additional pumps may also be located as needed within the coolant loop (e.g., on the coolant distribution modules, on liquid cooled cards, or other locations). In one or more embodiments, various sensors may monitor aggregate and individual branch coolant temperatures, pressures, flow rate quantities, or any combination thereof, at strategic points around the loop to identify loss of coolant or cooling.

In one or more embodiments an apparatus comprises a chassis comprising a plurality of slots for receiving a plurality of modules, a first group of modules received in a first orientation and a second group of modules received in a second orientation orthogonal to the first orientation, and a coolant distribution module configured for insertion into one of the slots in the first orientation and distributing coolant to at least one of the modules in the second group of modules for cooling components (electronics, optics) on the module. A second coolant distribution module may be inserted into one of the slots in the second orientation for distributing coolant to at least one of the modules in the first group of modules.

Referring now to the drawings, and first to FIG. 1, a plurality of modules (e.g., line cards 10, fabric cards 12) are shown arranged orthogonal to one another (i.e., edges/longitudinal surfaces of line cards and fabric cards are orthogonal (perpendicular) to one another). In this example, the line cards 10 are positioned horizontally and the fabric cards 12 are positioned vertically. For simplification only four line cards 10 and seven fabric cards 12 are shown and the chassis supporting the modules is not shown. Also, orthogonal data connectors between the horizontal line cards and vertical fabric cards are not shown, for simplification. It is to be understood that the system may include any number or type of modules 10, 12 with a first group of modules inserted in a first orientation and a second group of modules inserted in a second orientation orthogonal to the first orientation. As shown in the simplified schematic in FIG. 1, each line card 10 may include any number of electrical components 13 (e.g., ASIC (Application Specific Integrated Circuit) or other integrated circuit, chip, processor, or high heat density electronic component), optical components 14 (e.g., optical transceivers), or other components in which heat dissipation capability of the component is insufficient to moderate its temperature. Each module 10, 12 may include any number of components 13, 14, with liquid cooling provided to one or more of the components. As previously noted, air cooling (e.g., provided by one or more fans) may also be provided to cool one or more components or modules that do not receive liquid cooling or to provide additional cooling along with the liquid cooling.

In the example shown in FIG. 1, a vertical adapter card (also referred to herein as a coolant distribution module) 15 receives coolant at connector 16 (external plumbing connection) and distributes coolant via distribution lines 17 to each of the horizontal line cards 10 through a coupling 18 (e.g., quick disconnect or other pluggable liquid cooling connection) connected to distribution lines 19 passing through electronic components 13, 14. It is to be understood that the location of the vertical adapter card 15 shown in FIG. 1 is only an example and that the vertical adapter card may be located within any vertical slot in place of any of the fabric cards 12 and more than one vertical adapter card 15 may be used. The connector 18 and plumbing 19 may therefore be located at different locations along the edge of the line card 10 to mate with the coolant distribution module 15 inserted into different vertical slots within the chassis.

Figure 2:
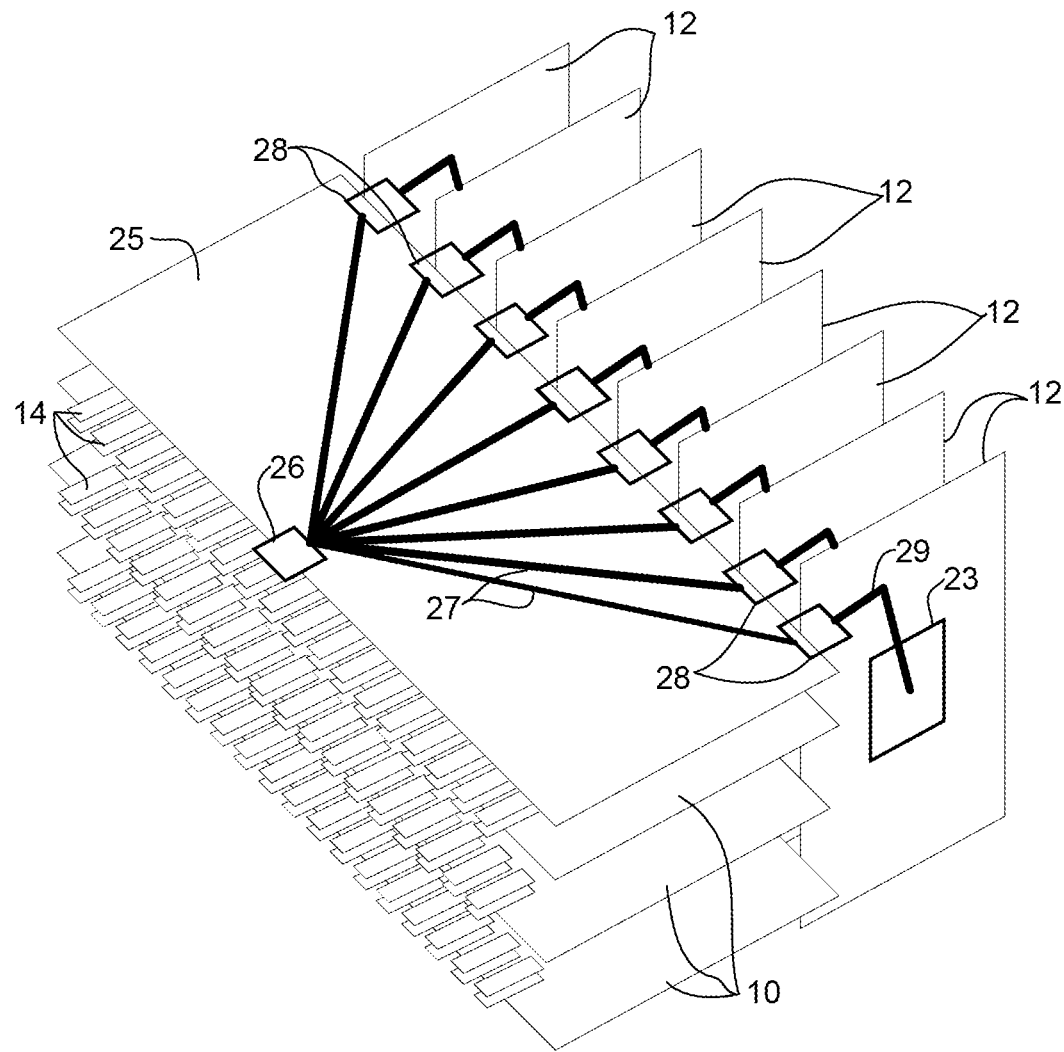
FIG. 2 illustrates liquid cooling distribution for vertical modules in the orthogonal system, in accordance with one embodiment.

Referring now to FIG. 2, an example is shown in which liquid cooling is provided to the vertical cards 12 through use of a horizontal adapter card (also referred to herein as a coolant distribution module) 25. Liquid coolant supply is received at external plumbing connection 26 and provided via distribution lines 27 to each of the vertical fabric cards 12 at couplings 28 (e.g., quick disconnect or other pluggable liquid cooling connection) connected to lines 29 to cool electronic components 23 on the fabric cards 12. As previously noted with respect to FIG. 1, the horizontal adapter card 25 may be inserted into any horizontal slot and more than one card 25 may be used.

Figure 3:
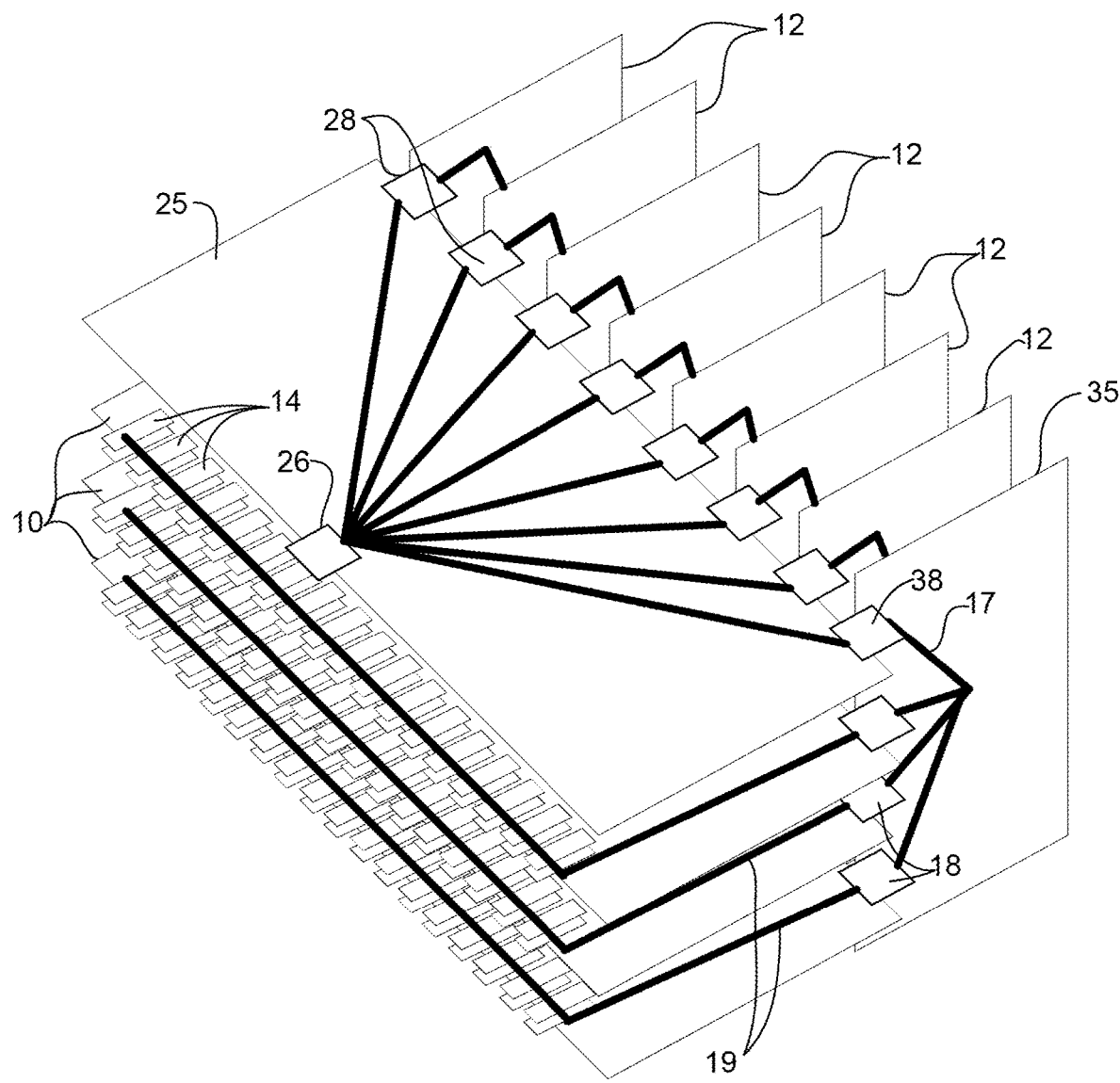
FIG. 3 illustrates liquid cooling distribution for both horizontal and vertical modules in the orthogonal system, in accordance with one embodiment.

FIG. 3 illustrates an example in which liquid cooling is provided for both the horizontal cards 10 and vertical cards 12. In this example, one horizontal module (line card) 10 and vertical module (fabric card) 12 are replaced with coolant distribution modules 25, 35, respectively. The external plumbing connection 26 distributes fluid through the horizontal adapter card 25 to the vertical cards 12 (as described above with respect to FIG. 2) and also supplies coolant to a vertical adapter card 35 at connector 38, which distributes coolant through distribution lines 17 to couplings 18 connected to each horizontal card 10 (as described above with respect to FIG. 1). This eliminates the need for an external plumbing connection at vertical adapter card 35. As previously described, more than one horizontal adapter card 25 or vertical adapter card 35 may be used to provide redundancy or additional cooling capacity.

It is to be understood that the liquid cooling distribution systems shown in FIGS. 1, 2, and 3 are only examples and that other distribution configurations may be used, without departing from the scope of the embodiments. For example, any number of horizontal line cards 10 (e.g., none, one, some, or all) may be configured to receive liquid cooling and any number of vertical modules 12 (e.g., none, one, some, or all) may be configured to receive liquid cooling, with any remaining cards air cooled by fans. Thus, conventional line cards or fabric cards that are air cooled by fans and not configured for liquid cooling may be used with the coolant distribution module in place. The chassis may be configured to have dedicated slots for the coolant distribution modules 15, 25, 35 or a conventional chassis may use one or more existing line card or fabric card slots to receive the coolant distribution module.

In the examples shown herein, external plumbing connections 26 are provided on a front face plate of the horizontal adapter card 25. The external plumbing connections may also be located on a side, rear, or top of the chassis. For example, in one or more embodiments, external plumbing may be provided from the rear for the vertical adapter card to provide cooling to horizontal line cards 10 and to a horizontal adapter card, which in turn provides cooling to vertical fabric cards 12. Coolant distribution may be provided from a rear of the chassis, for example, by passing coolant lines through a fan tray designed to provide space for the coolant lines. Also, one or more fans may be removed to provide room for coolant distribution or the lines may pass through a space within the fan tray, between, above, or below, the fans, for example. The coolant distribution lines may also pass through an access panel on the side or top of the chassis.

Figure 4:
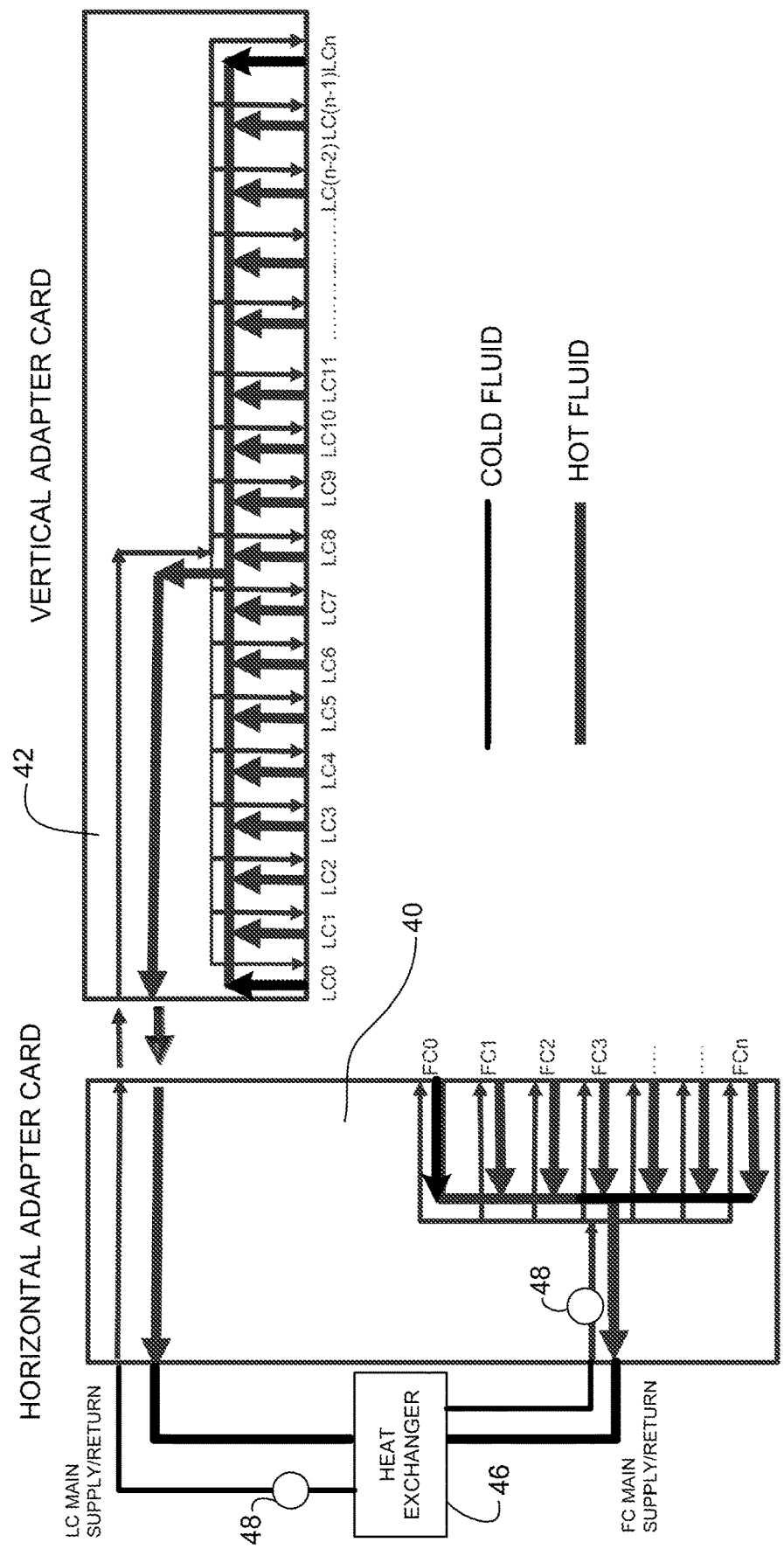
FIG. 4 is a schematic illustrating liquid cooling distribution in coolant distribution modules of the orthogonal system of FIG. 3, in accordance with one embodiment.

FIG. 4 is a fluid schematic showing an overview of the coolant distribution within horizontal adapter card (coolant distribution module) 40 and vertical adapter card (coolant distribution module) 42, in accordance with one embodiment. In this example, the horizontal adapter card 40 includes two external plumbing connections, one for delivering coolant to the vertical adapter card 42 (LC Main Supply/Return) and the other for delivering coolant to the vertical fabric cards (FC Main Supply/Return). The LC Main Supply/Return provides coolant to the vertical adapter card 42, which in turn delivers coolant to one or more horizontal line cards (LC0 . . . LCn). The FC Main Supply/Return provides coolant to one or more fabric cards (FC0 . . . FCn) through the horizontal adapter card 40.

The distribution plumbing comprises supply lines (cold fluid) and return lines (hot/warm fluid). Separate tubing may be provided for the supply and return lines, as shown in FIG. 4 or a single tube with separate conduits for supply and return may be used, with sufficient thermal isolation between the supply and return lines, which would reduce the amount of external and internal fluid connectors. As described in the examples below, distribution lines may pass above or to the side of orthogonal connectors or within the space of the connector to pass coolant lines between horizontal and vertical cards. In one example, the external connector comprises a supply coupling for receiving cold fluid and a return coupling for returning hot/warm fluid after cooling components on the line cards and fabric cards. The external connector may comprise two separate connectors for coupling two separate lines (supply and return) or a manifold comprising separate connections and internal passages, with sufficient separation between the supply and return channels.

In the example shown in FIG. 4, the LC Main Supply/Return and FC Main Supply/Return are each in fluid communication with an external heat exchanger 46. As described below, the horizontal adapter card 40 may comprise two pairs of external connectors (supply/return for line card cooling and supply/return for fabric card cooling). The fluid distribution lines may also be aggregated within the horizontal adapter card and only one pair of connectors (supply/return) used. Also, the horizontal line card 40 and vertical adapter card 42 may each have their own external connections in fluid communication with one or more heat exchanger 46. Each coolant loop may comprise one or more pumps 48 external to the chassis or located on the coolant distribution module. In another example, the coolant distribution module may include a pump to off-load thermal load from the modules without the need for external plumbing.

The size of the fluid distribution lines may be determined based on the number of modules to be cooled and the thermal capacity of the modules. For example, different capacity coolant distribution modules may be used based on the number of modules to be cooled using liquid cooling (e.g., one to seventeen (or more) lines cards and one to seven (or more) fabric cards). Flow network modeling may be performed to take into account pumps, quick disconnects, and fluid lines, as well as the number of modules. Flow network modeling may also be performed on the cards, taking into account the cooling distribution system on the cards, including fittings, tees, elbows, cold plates, or any other parts of the distribution system, and flow pressure and temperature distribution over the card. Hydraulic and thermal resistance of cold plates and cards may be determined and optimized. The heat exchanger may be sized to adequately remove heat produced by the cards via the coolant distribution system.

Figure 5:
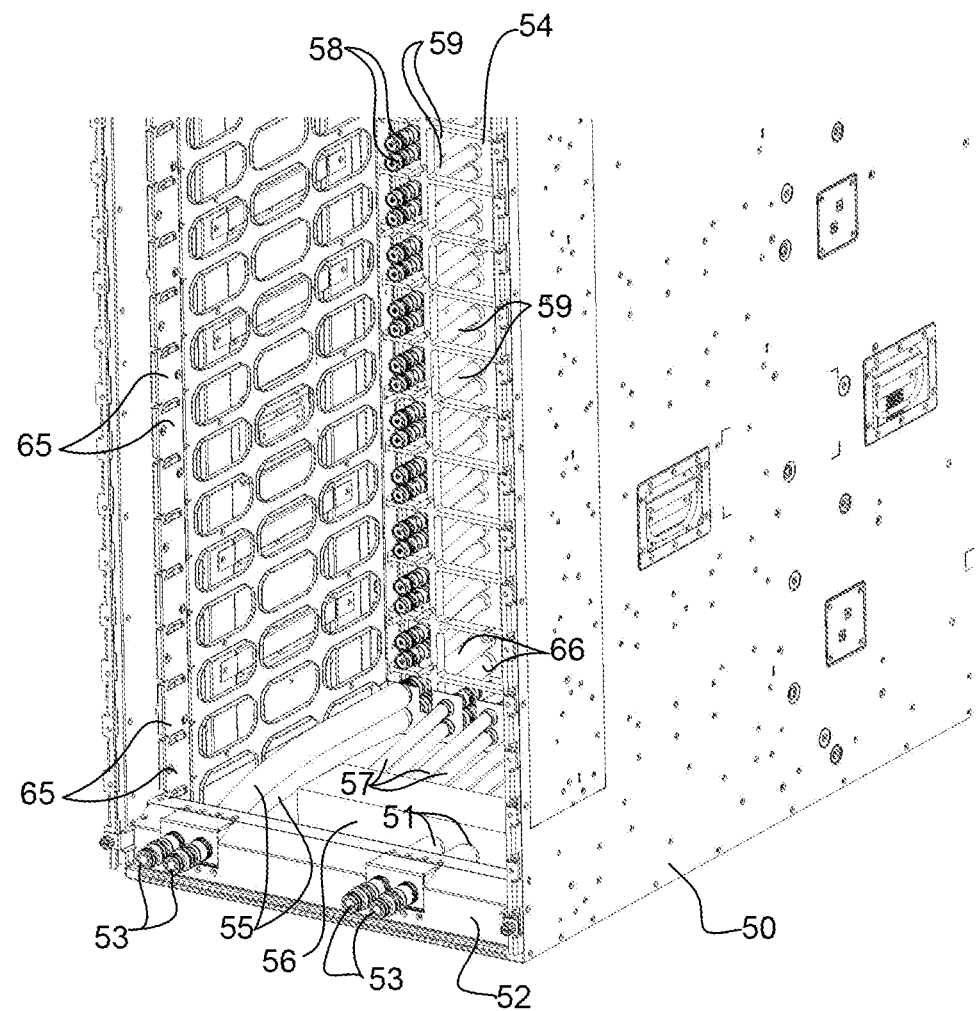
FIG. 5 is a partial front perspective illustrating the coolant distribution modules inserted into a chassis, in accordance with one embodiment.

FIG. 5 is a front perspective of a chassis 50 with a horizontal card adapter (coolant distribution module) 52 and vertical card adapter (coolant distribution module) 54 installed. The chassis 50 may include one or more frames or structures configured to support components and slidably receive any number of removable modules (adapter cards, line cards, fabric cards, or other removable modules). The chassis frame 50 may be formed from any suitable material including, for example, aluminum, steel, or any other metal, non-metal, or composite material.

As described above with respect to FIG. 4, in one or more embodiments, the horizontal coolant distribution module 52 may include two pairs of external connectors 53, each pair comprising a supply line connector and a return line connector. The connector 53 may be a quick disconnect or any other suitable connector that prevents loss of fluid when disconnected from associated external cooling lines. In this example, two external connectors 53 are coupled to supply and return lines 55 for supply and return of coolant to and from the vertical adapter card 54 via distribution lines 66. The vertical adapter card 54 distributes coolant to and receives return coolant from horizontal line cards (not shown) at connectors 58 (internal connectors) via coolant distribution lines 59. The other two external connectors 53 are coupled to coolant distribution lines 51 attached to a manifold 56 configured to supply (distribute) coolant to and receive (aggregate) return coolant from vertical fabric cards (not shown) via lines 57. The lines 51, 55, 57, 59 are suitably sized to provide sufficient flow for cooling components on the modules, as previously described. As noted above, the supply and return lines may be combined into a single line comprising isolated supply and return conduits.

Figure 6:
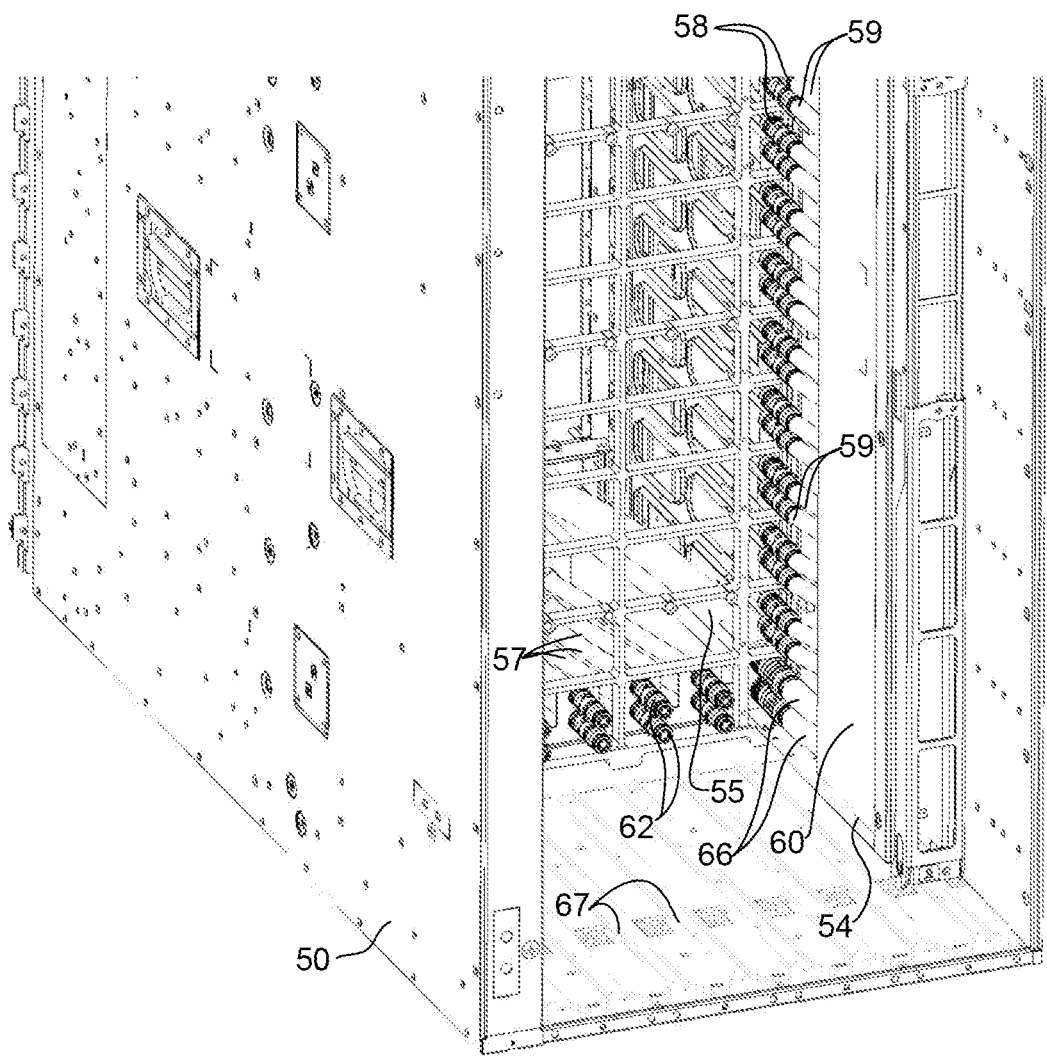
FIG. 6 is a partial rear perspective of the chassis and coolant distribution modules of FIG. 5.

FIG. 6 is a rear perspective of the chassis 50 shown in FIG. 5. The vertical adapter card 54 comprises a manifold 60 for distribution of the supply coolant and aggregation of the return coolant via lines 59 coupled to connectors 58 for attachment to the horizontal line cards (not shown). The coolant lines 57 of the horizontal adapter card 52 are coupled to connectors 62 at their open ends for attachment to the vertical fabric cards (not shown). As shown in the example of FIGS. 5 and 6, the horizontal adapter card 52 and horizontal line cards are installed from a front of the chassis 50 into slots 65, and the vertical adapter card 54 and vertical fabric cards are installed from a rear of the chassis into slots 67.

It is to be understood that the type, number, and arrangement of slots 65, 67 and adapter cards 52, 54 shown in FIGS. 5 and 6 is only an example and the chassis may include any number of slots for receiving any number or type of modules, including, for example, fabric cards, line cards, service cards, combo cards, controller cards, processor cards, high density line cards, high power line cards, or high density and power line cards, arranged in any format (e.g., positioned horizontally or vertically). Also, as previously noted, the adapter cards 52, 54 may be inserted into any slot 65, 67 within the chassis 50.

As previously noted, one or more of the line cards or fabric cards may not be configured for liquid cooling and only air cooled. Thus, the coolant distribution lines 57, 59 and internal connectors 58, 62 are preferably configured so as not to interfere with orthogonal connectors on conventional air cooled cards, and may be offset or recessed as described below.

Figure 7:
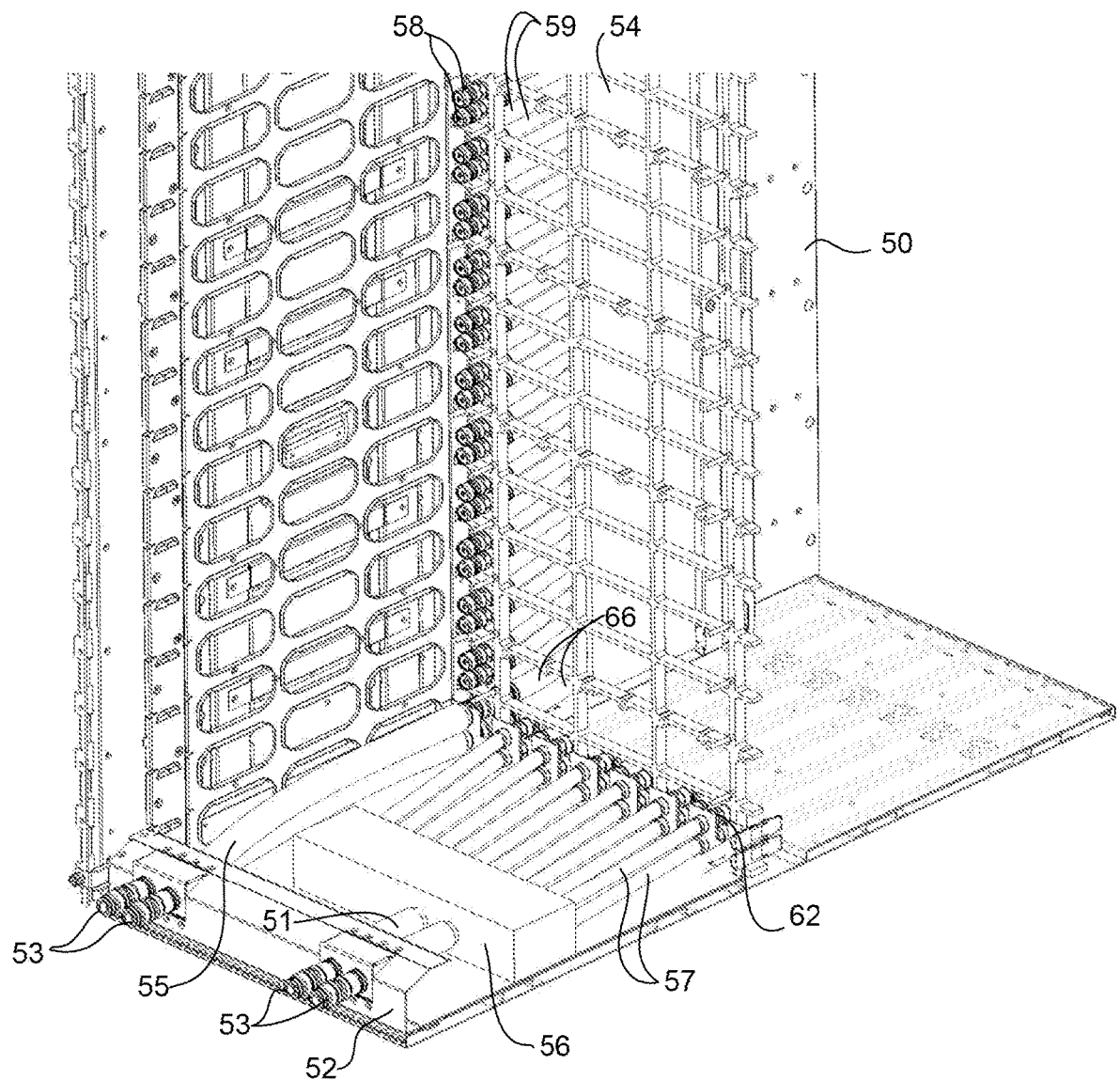
FIG. 7 is the front perspective shown in FIG. 5 with a portion of the chassis removed to show detail.
Figure 8:
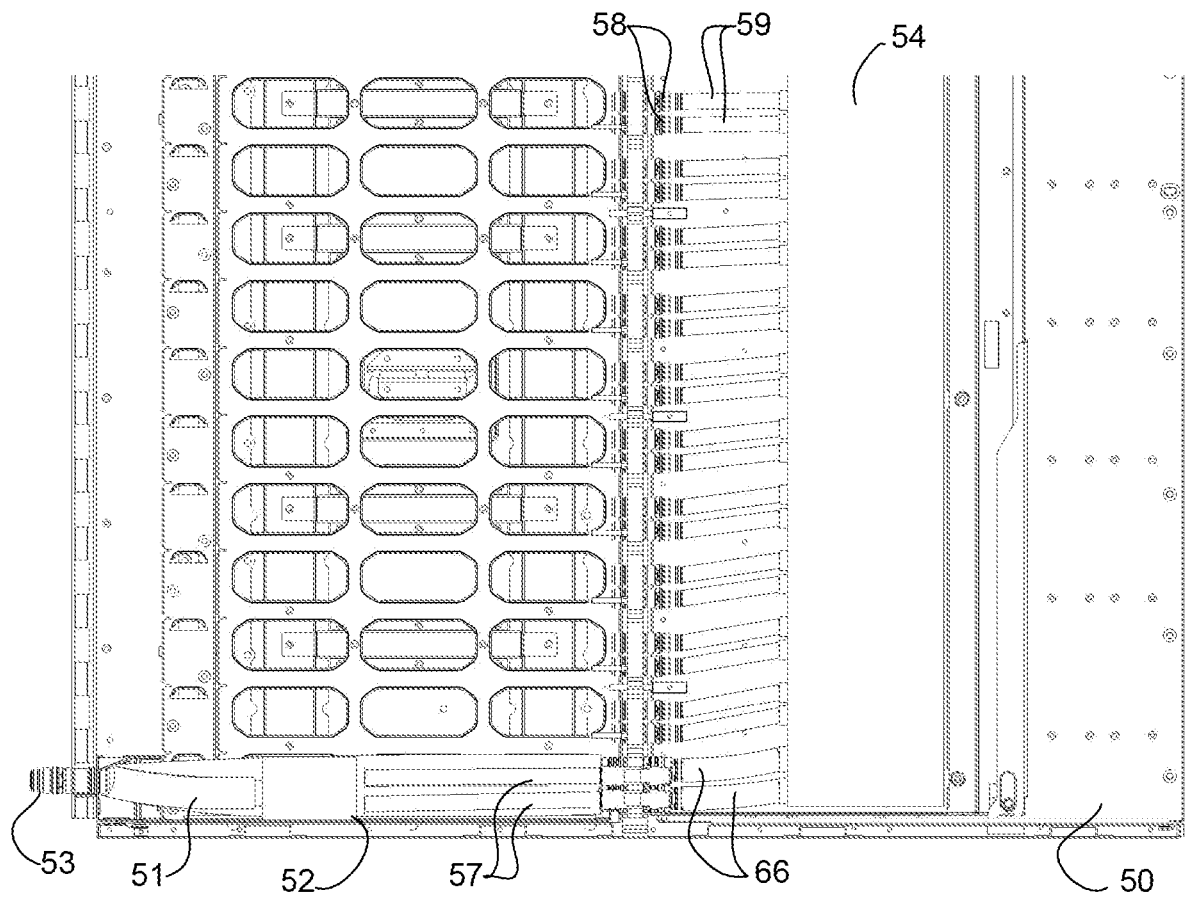
FIG. 8 is a side view of the chassis and coolant distribution modules shown in FIG. 7.

FIGS. 7 and 8 are a perspective and side view, respectively, of the chassis 50 shown in FIGS. 5 and 6, with a wall of the chassis removed to show additional detail of the horizontal adapter card 52 and vertical adapter card 54, including distribution lines 51, 55, 57, 59, 66, external connectors 53 and internal connectors 58, 62. As shown in FIG. 7, the coolant distribution lines (supply and return) 55 in fluid communication with the vertical adapter card 54 may have a larger diameter than coolant lines 57, which are sized for coolant distribution to individual vertical fabric cards and return from the fabric cards. Similarly, coolant lines 66 coupled to lines 51 may have a larger diameter than lines 59, which are sized for coolant distribution to individual horizontal line cards and return from the line cards. Lines 51 provide coolant to or receive coolant from the manifold 56 and are also sized for higher flow.

Figure 9:
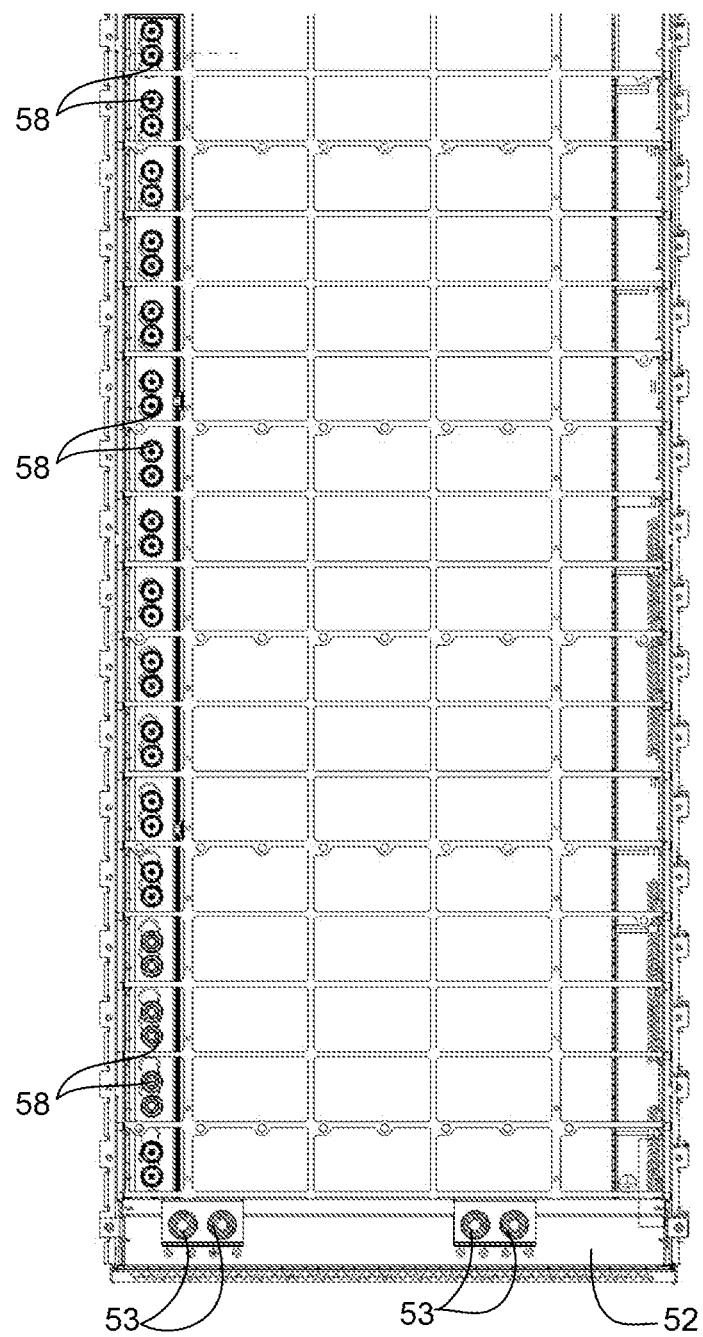
FIG. 9 is a front view of the chassis and coolant distribution modules shown in FIG. 5.
Figure 10:
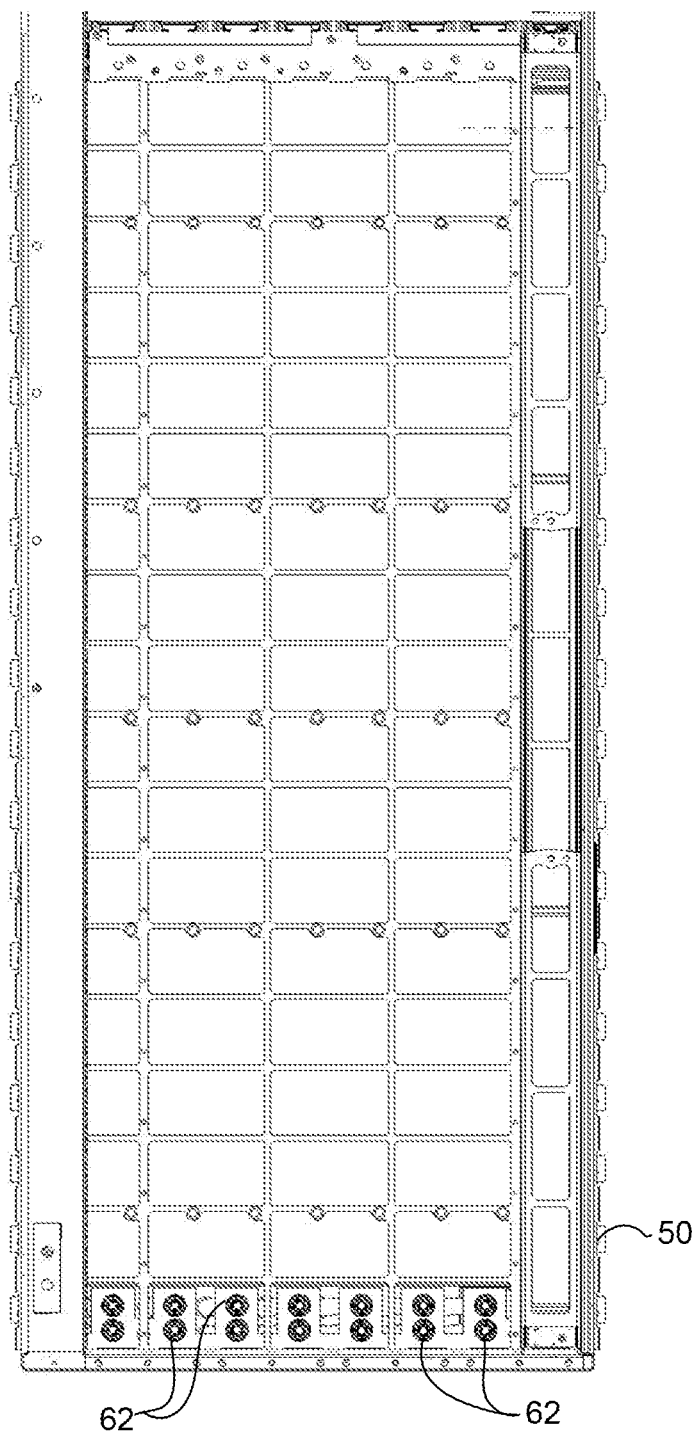
FIG. 10 is a rear view of the chassis and coolant distribution modules shown in FIG. 6.

FIG. 9 is a front view of the chassis 50 showing the external connectors 53 for the horizontal adapter card 52 and internal connectors 58 for coolant flow to and from horizontal line cards (not shown). FIG. 10 is a rear view of the chassis 50 showing internal connectors 62 for distribution of coolant to and receiving return flow from the vertical fabric cards (not shown).

Figure 11:
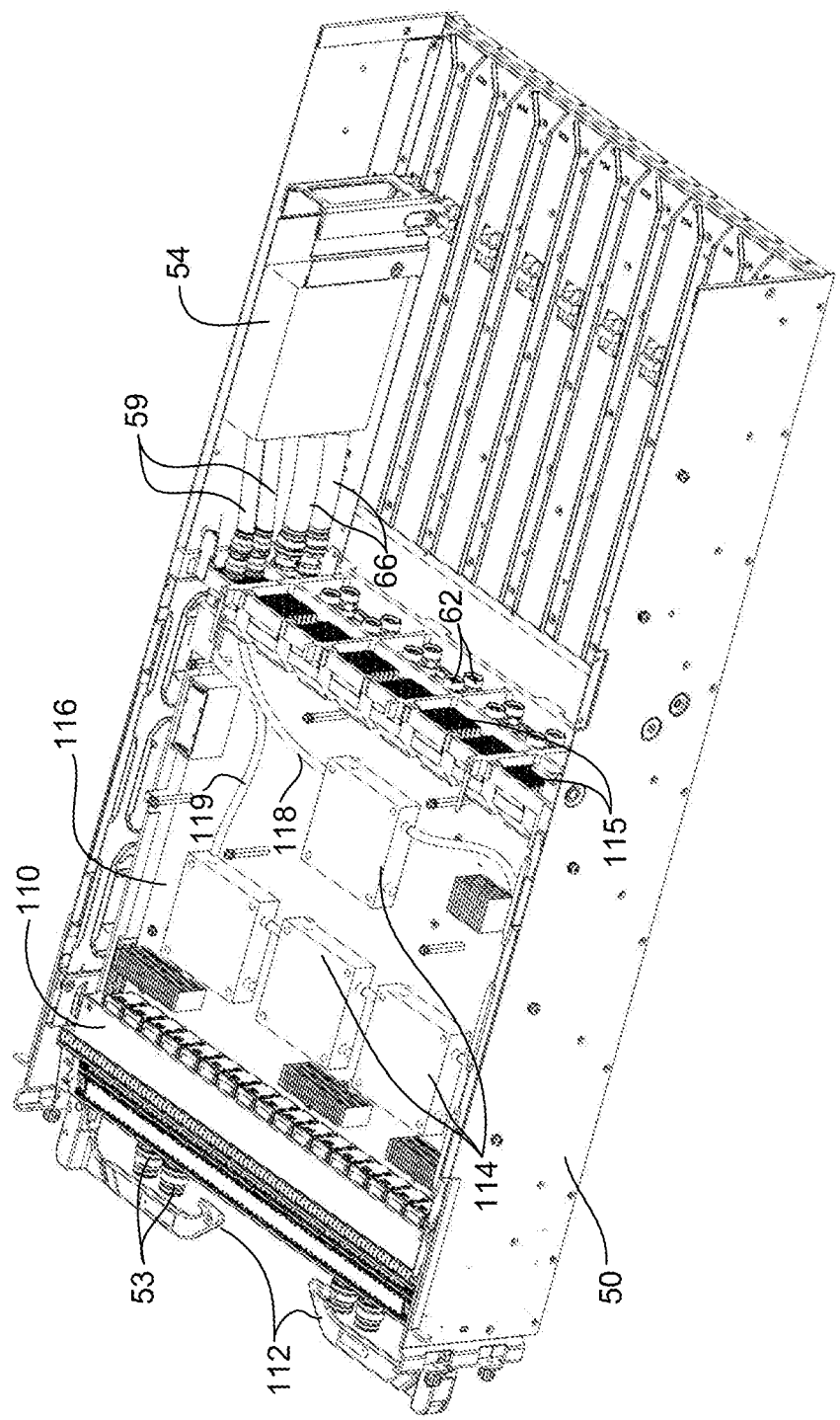
FIG. 11 is a cutaway perspective showing a liquid cooled line card inserted into the chassis with the coolant distribution modules.

FIG. 11 is a top cutaway perspective of a horizontal line card (module) 110 installed in a slot of the chassis 50. In this example, the line card 110 is installed in the slot immediately above the horizontal adapter card. The line card 110 receives coolant at supply line 59, which is delivered to electronic components 114 via line 118 and hot/warm coolant is returned through line 119 to the vertical adapter card 54. The line card 110 includes quick disconnects for mating with the internal connectors 59 of the vertical adapter card 54. The line card 110 may include one or more electronic circuits and components 114 on a printed circuit board 116 and data interfaces (orthogonal connectors) 115 for mating with vertical fabric cards. The printed circuit board 116 may include any number of components including, for example, one or more chip, die, multi-chip module, optical device, in-package optics, integrated circuit, ASIC (Application-Specific Integrated Circuit), chiplet, optical engine, photonic chip, NPU (Network Processing Unit), or any other circuit, device, or component. The component 114 may include, for example, a cold plate (or other thermal control element) in thermal communication with a heat generating device (e.g., electrical component) with the coolant flowing through the cold plate via inlet line 118 and return line 119. Thermal control elements may include liquid cooled heatsinks, cold plates, multi-phase cold plates, heat pipes, or other devices directly attached to the hottest components to directly remove their heat. As described below with respect to FIG. 22, the line card 110 may include one or more sensors for monitoring temperature (e.g., ambient temperature, coolant temperature, component temperature), or pressure, velocity, or flow rate of the coolant. The sensors may be located, for example, in the lines 118, 119, components 114 or other locations on the line card.

The line card 110 may also include one or more electronically controlled valves (flow control valve, flow valve, servo valve) for controlling fluid distribution within the line card. In one example, the flow control valve may be connected to supply line 59 or fluid inlet line 118 to control coolant distribution to the line card. In another example, one or more valves may be located at inlet lines delivering coolant to one or more components 114 to control coolant distribution among components within the line card. A system controller may receive input from electronics mounted on the line card or from a central controller in the chassis (e.g., mounted on another line card or fabric card or contained within the coolant distribution module 54).

The line card 110 may include a plurality of ports or other openings configured to receive connectors, cables, or pluggable transceiver modules (e.g., small form factor pluggable (SFP) transceiver modules, optical transceiver modules, etc.). The line card 110 may comprise one or more handles (arms) 112 for use in inserting or removing the line card from the chassis 50.

FIGS. 12A, 12B, 13A, 13B, 14, 15A, and 15B illustrate details of the coolant distribution modules (horizontal adapter card 52, vertical adapter card 54), in accordance with one embodiment. As previously described, the coolant distribution module is configured for insertion into the chassis 50 of a network device in a first orientation for delivering coolant to at least one of the modules (line card, fabric card) inserted into the chassis in a second orientation orthogonal to the first orientation for cooling components on the module. The coolant distribution module comprises a plurality of internal connectors for connection to one or more of the modules and coolant distribution lines for delivery of coolant from the external connectors to the internal connectors.

Figure 12A:
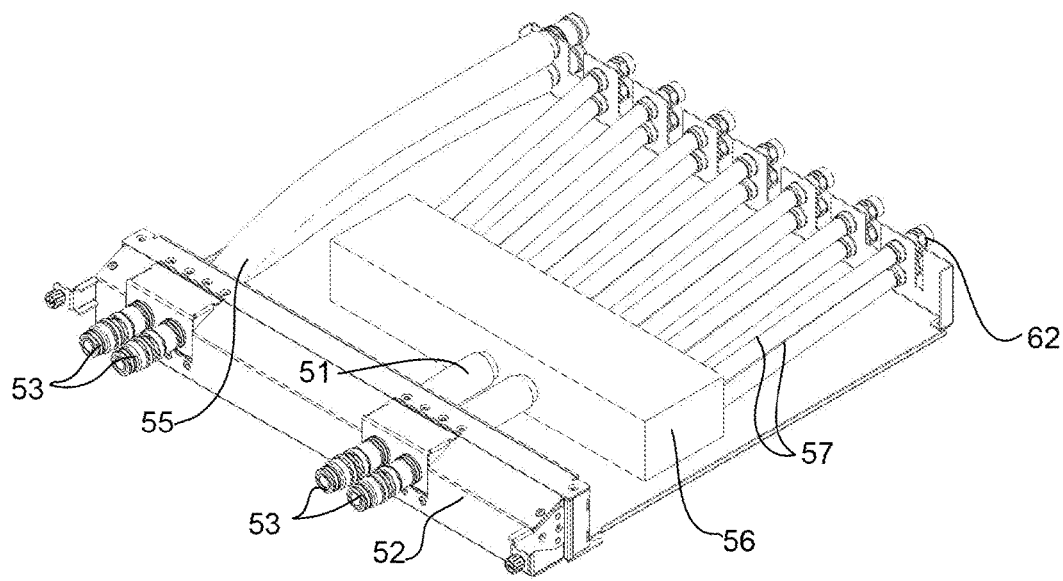
FIG. 12A is a front perspective of the horizontal coolant distribution module.
Figure 12B:
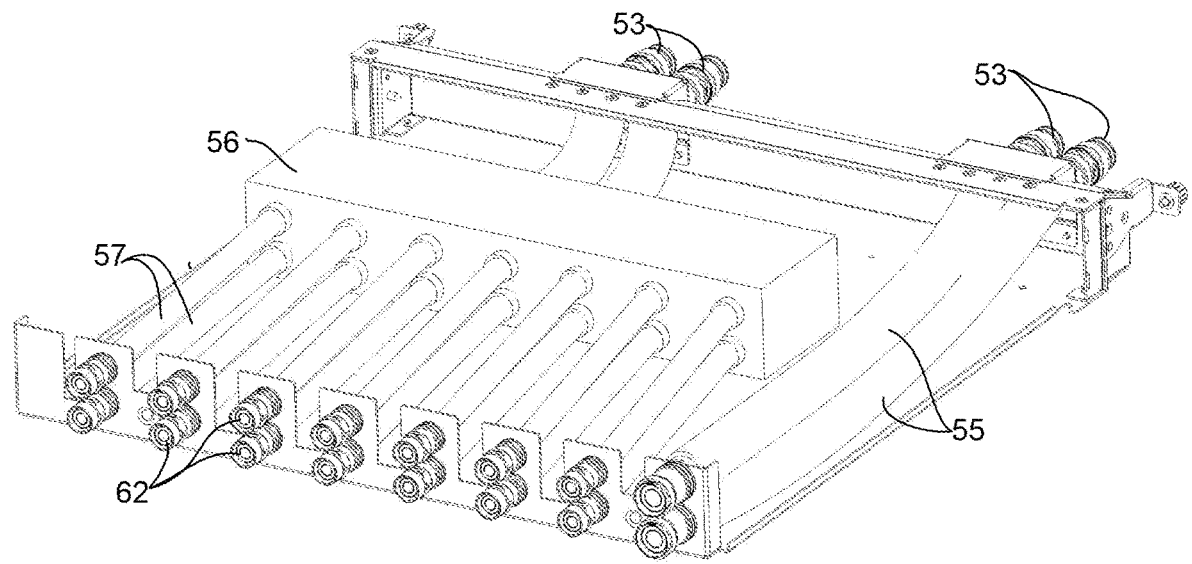
FIG. 12B is a rear perspective of the horizontal coolant distribution module.
Figure 13A:
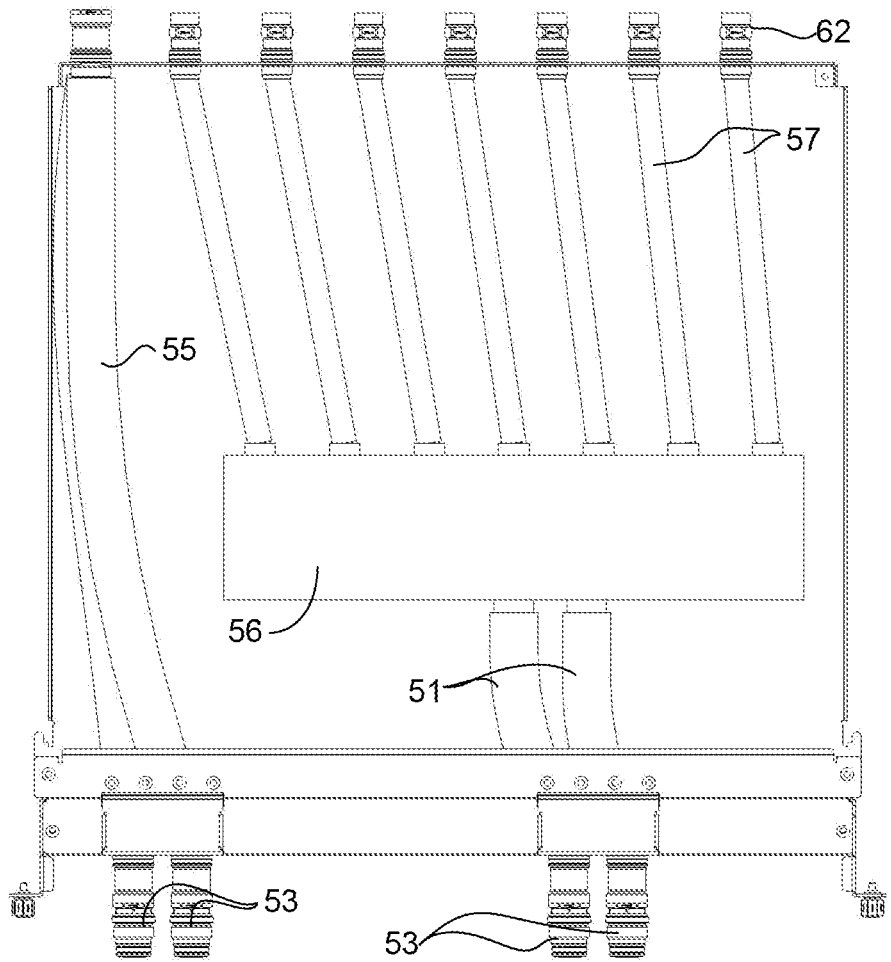
FIG. 13A is a top view of the horizontal coolant distribution module.
Figure 13B:
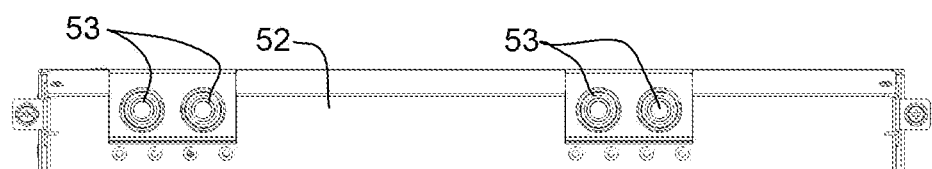
FIG. 13B is a front view of the horizontal coolant distribution module.

FIGS. 12A and 12B are perspective views, FIG. 13A is a top view, and FIG. 13B is a front view (e.g., front of chassis 50) of the horizontal adapter card 52. As previously described, the horizontal adapter card 52 comprises two pairs of external connectors (quick disconnects) 53 attached to lines 55 for fluid communication with the vertical adapter card, and lines 51 connected to manifold 56, which is also attached to a plurality of lines 57 for fluid communication with the vertical fabric cards. In this example, the external quick disconnects 53 are located on a front face plate of the adapter card 52 for easy access. As previously noted, the external connectors may also be located on a rear, top, or side panel of the chassis.

Figure 14:
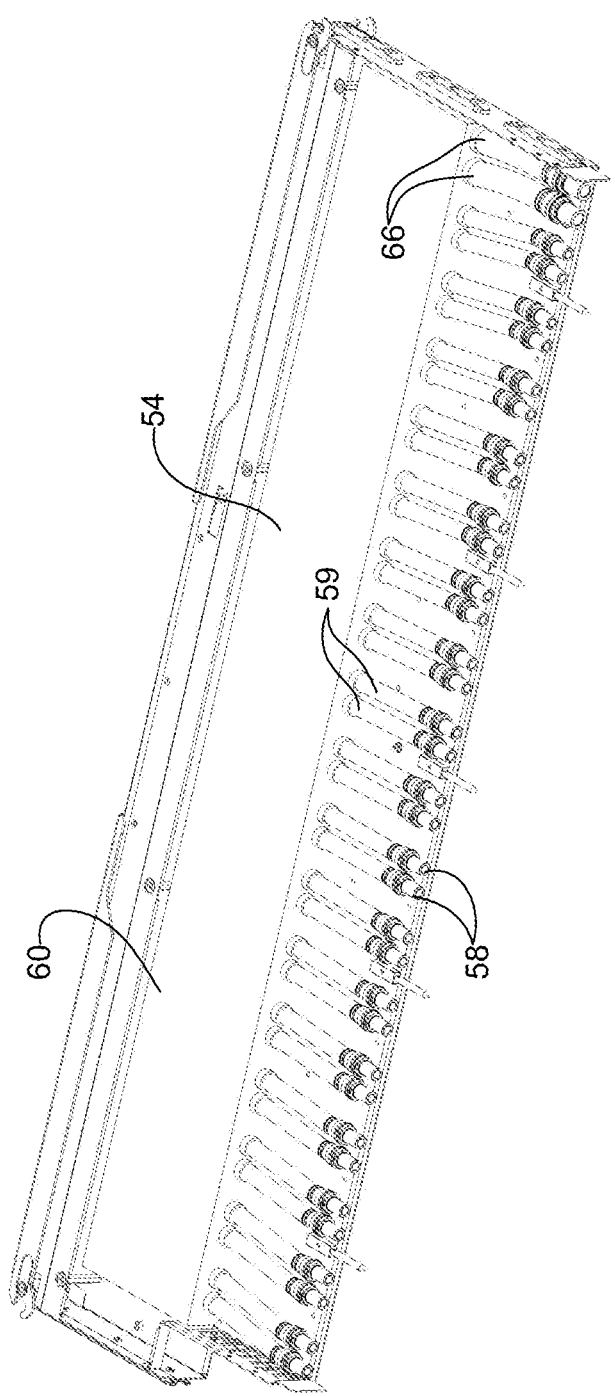
FIG. 14 is a perspective of the vertical coolant distribution module.
Figure 15A:
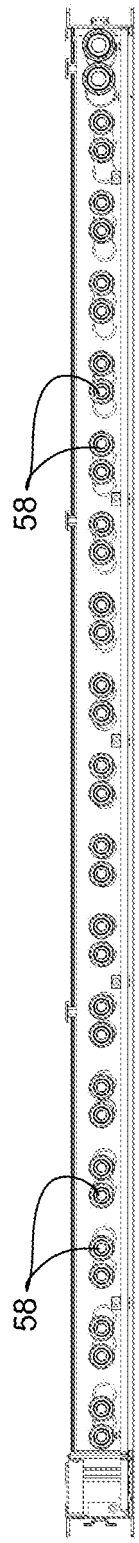
FIG. 15A is a front view of the vertical coolant distribution module.
Figure 15B:
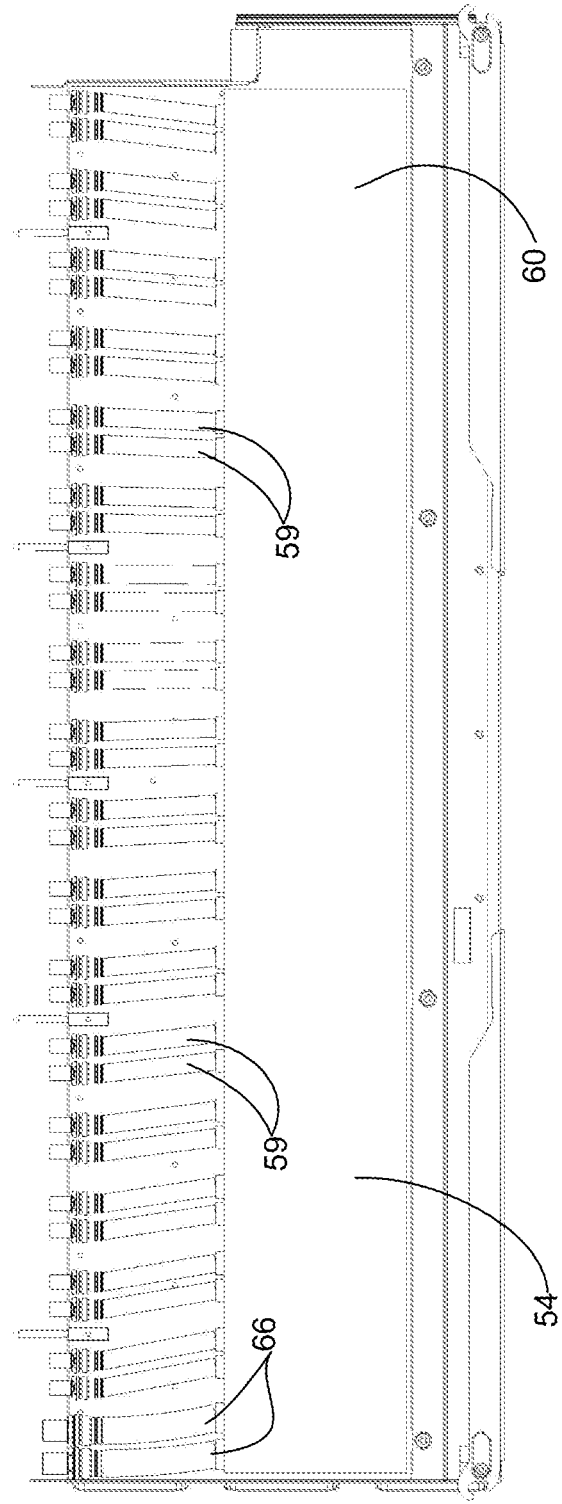
FIG. 15B is a side view of the vertical coolant distribution module.

FIG. 14 is a perspective, FIG. 15A is a front view (e.g., front of chassis), and FIG. 15B is a side view of the vertical adapter card 54, in accordance with one embodiment. In this example, manifold 60 receives coolant supply from the horizontal adapter card at supply line 66 and distributes the coolant to horizontal line cards at supply lines 59. Return coolant is returned to the manifold at the return distribution lines 59, where the warm/hot coolant is aggregated and sent out return line 66 to the horizontal adapter card 52. As previously noted, the coolant may also be supplied to the vertical adapter card 54 at an external connector separate from the horizontal adapter card.

It is to be understood that the coolant distribution modules 52, 54 shown in FIGS. 12A, 12B, 13A, 13B, 14, 15A, and 15B are only examples and that other configurations may be used without departing from the scope of the embodiments. For example, as previously noted, the distribution lines 51, 55, 57, 59, 66 may be configured to carry both supply and return fluid conduits within one tube, which would reduce the number of lines and connectors in the fluid distribution system. Also, the coolant distribution system may be self-contained on one or more of the coolant distribution modules 52, 54 and include a pump and heat exchanger or heat sink to off-load thermal load from the line cards or fabric cards without the need for any external plumbing.

As previously noted, more than one coolant distribution module 52, 54 may be used to provide cooling path redundancy or additional cooling capacity. Each coolant distribution module may comprise its own external plumbing connection so that a loss of liquid cooling flow from a single external plumbing connection will not cause possible heat damage or shut down the system. Also, this would allow repair of one coolant distribution module while the other coolant distribution module carries the full system load. The dual redundant cooling loops may be managed with checks valves or completely isolated from one another.

In one or more embodiments, the coolant distribution module 52, 54 may also include sensors and control components (flow valves, pumps, restrictors) for use in meeting coolant flow requirements to each individual branch (line card, fabric card), as described below with respect to FIGS. 24 and 26. The control system may be, for example, open loop with a manual valve set at system configuration time or a closed loop system using one or more servo valves regulated by feedback from temperature sensors or coolant return temperatures. The control system may also include a leak detection system (e.g., moisture sensor, flow sensor, pressure sensor) configured to shut off coolant flow if a leak is detected, as described below with respect to FIG. 22.

As previously described, the liquid cooling distribution system may be used along with conventional air cooling provided by one or more fans. In one or more embodiments, conventional line cards or fabric cards designed for only air cooling may be used along with modules configured for liquid cooling to provide backwards compatibility and allow for a mix of air cooled modules and liquid cooled modules (or air and liquid cooled modules). The horizontal and vertical coolant distribution modules 52, 54 described herein may also be inserted into a chassis in which all modules (horizontal and vertical cards) are air cooled and not configured for liquid cooling. These modules may be replaced at a later time with modules configured for liquid cooling. Various mechanisms or designs may be implemented to avoid damage to the orthogonal connector if a horizontal or vertical coolant distribution module is used with one or more conventional modules (air cooled line cards or fabric cards) that are not configured for liquid cooling. FIGS. 16, 17A, 17B, 17C, 18A, 18B, 19A, and 19B show examples of design configurations or mechanisms that may be used to prevent damage to the orthogonal connectors located at the interface between the air cooled modules (e.g., conventional line card or fabric card) and the cooling distribution module.

Figure 16:
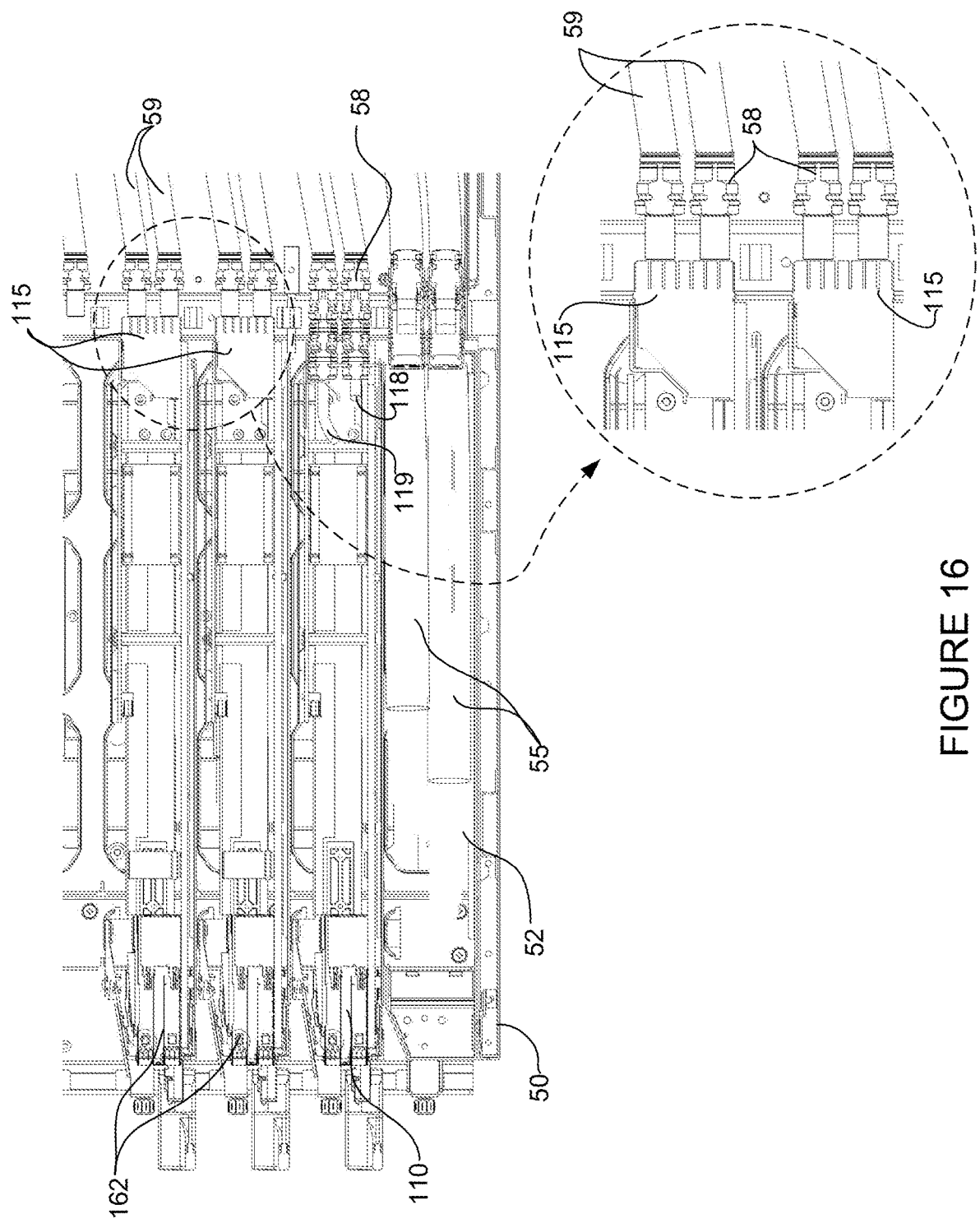
FIG. 16 is a partial side view of the chassis and coolant distribution modules with both air cooled and liquid cooled line cards with a portion of the chassis removed to show detail, in accordance with one embodiment.

FIG. 16 is a partial side view of the chassis 50 with one wall removed to show detail. In this example, one liquid cooled line card 110 is inserted into a slot immediately above the horizontal line card adapter 52. Two conventional line cards 162 inserted above the liquid cooled line card 110 are configured only for air cooling (i.e., no coolant lines). Liquid cooling connectors 58 engage with the liquid cooled card 110 on card insertion and sit recessed from orthogonal connectors 115 on the conventional air cooled cards 162 at the interface between the line card 162 and the vertical adapter card (connectors 58). The conventional line cards 162 are inserted into the slots without interference with the coolant connectors 58 and distribution lines 59 of the vertical adapter card. The cooling components (connectors 58) on the vertical adapter card are recessed from the conventional line card mating connectors 115, thus there is no interference between the vertical adapter card and line cards 162.

Similar to the example described above with respect to FIG. 16, a conventional vertical fabric card (module), which is not configured for liquid cooling, may be inserted into a chassis with a horizontal coolant distribution module for distributing coolant to at least one vertical card.

Figure 17A:
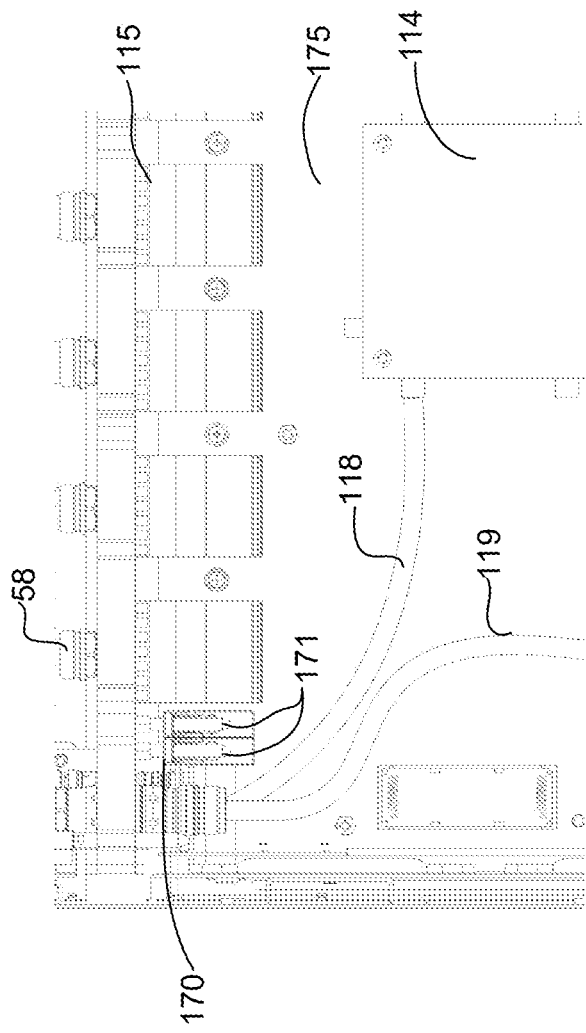
FIG. 17A is a partial top view of a line card connected to the vertical coolant distribution module with a keying guide at a connection interface, in accordance with one embodiment.
Figure 17C:
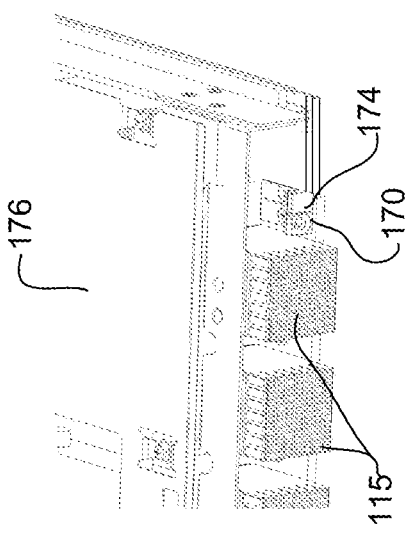
FIG. 17C is a partial front perspective of a line card configured only for air cooling with the keying guide blocked.
Figure 17B:
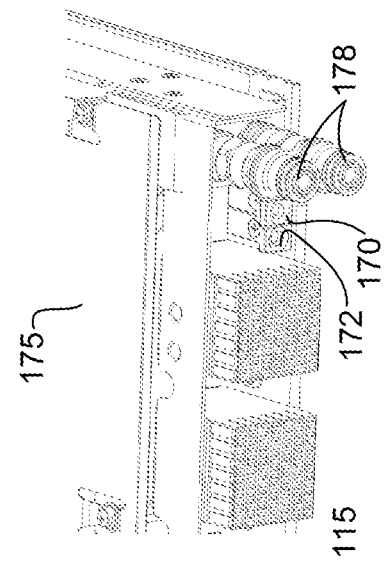
FIG. 17B is a partial front perspective of the line card shown in FIG. 17A.

FIGS. 17A-17C illustrate an example of a keying member 170 disposed at an interface between horizontal and vertical modules, in accordance with one embodiment. The keying member 170 is used to align the modules and protect orthogonal cables from damage. In the example shown in FIGS. 17A-17C, receptacle block options on a horizontal line card 175 may determine the keying features. FIG. 17A shows two keyed guide pins 171 extending from the vertical adapter card and inserted into the keying member 170 on the line card 175. A second guide pin is installed on the vertical adapter card for the horizontal slot where the plumbing mates. FIG. 17B is a rear perspective of the line card 175 showing the keying member 170 with openings 172 for receiving the guide pins 171 when inserted into chassis. FIG. 17C illustrates a blocked guide receptacle 174 on keying member 170 on a line card that does not use liquid cooling.

Figure 18A:
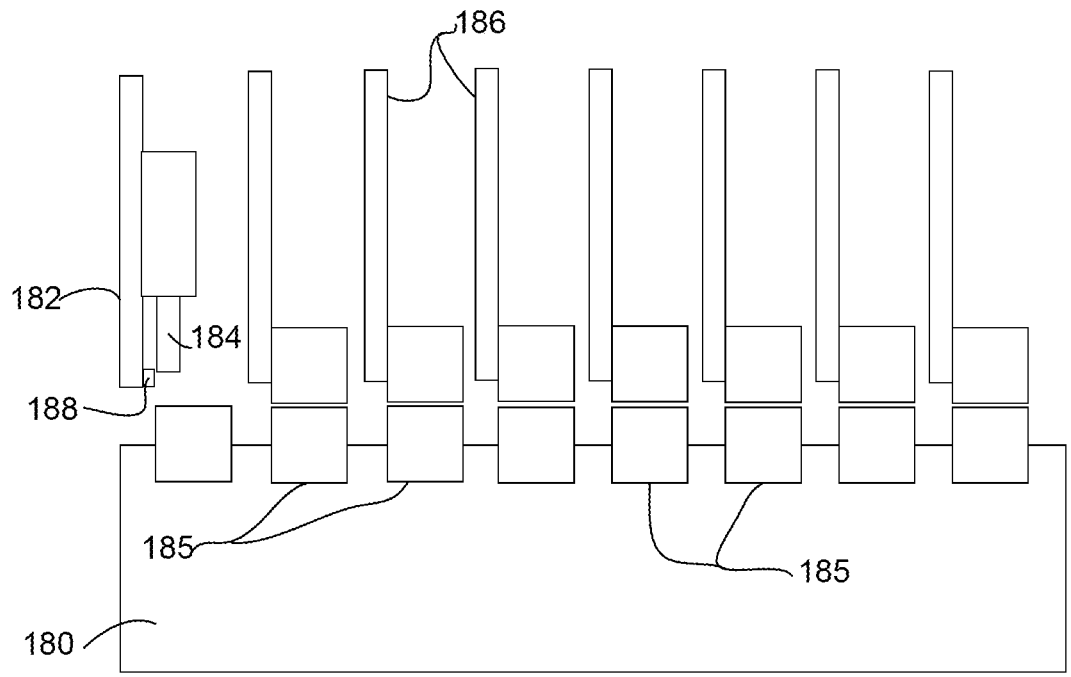
FIG. 18A is a top schematic view of an interface between an air cooled module and the coolant distribution module with a recessed liquid cooling connection, in accordance with one embodiment.
Figure 18B:
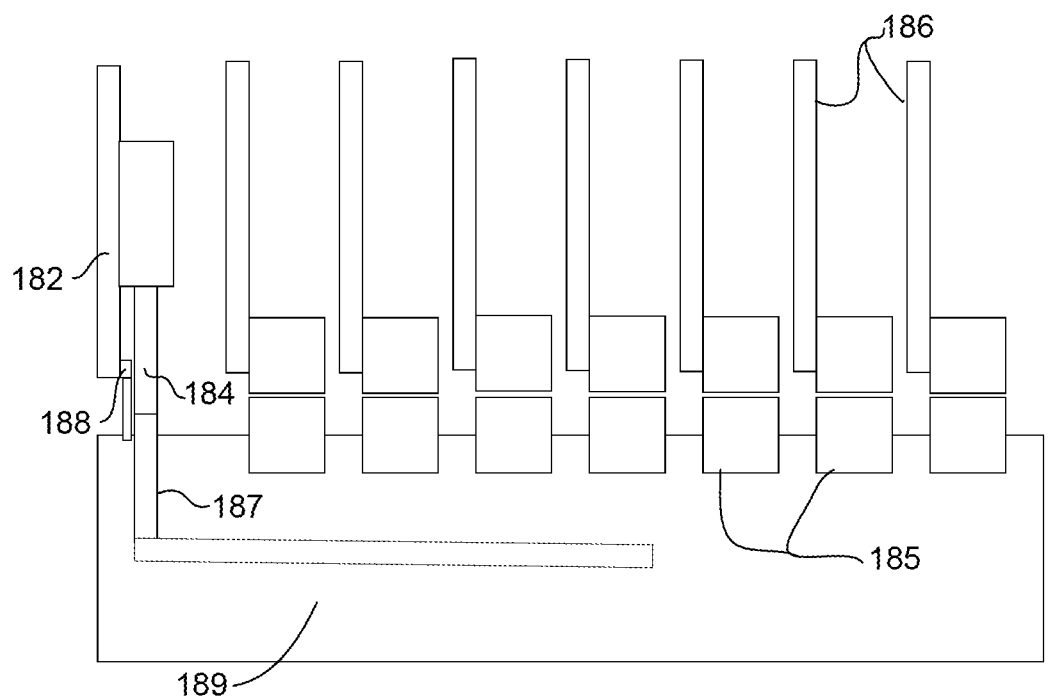
FIG. 18B is a top schematic view of an engaged connection between a liquid cooled module and the coolant distribution module of FIG. 18A.

FIGS. 18A and 18B illustrate a liquid cooling interface operable to recess from its normal operating position when not engaged (i.e., not plugged into chassis or plugged into a card that does not support liquid cooling). A horizontal line card 180, which is not configured for liquid cooling, is shown in FIG. 18A installed in a chassis with vertical coolant distribution module 182 comprising coolant infrastructure (lines/connectors) 184. In this example, the liquid cooling infrastructure 184 recesses when not engaged to prevent interference with orthogonal connector 185. The remaining orthogonal connectors 185 are connected to vertical fabric cards 186. The vertical coolant distribution module 182 includes a sensor 188 with retractable plumbing infrastructure 184 that detects when it is inserted into a slot interfacing with a card with compatible liquid cooling infrastructure, thereby preventing damage to the orthogonal connector 185 on air cooled module 180. The sensor 188 may comprise various types of mechanisms, including for example, a keying feature, push button, or near field proximity sensor. Once the vertical adapter card 182 is engaged with a corresponding horizontal liquid cooled module 189 (FIG. 18B), the coolant infrastructure 184 extends to engage with the coolant infrastructure 187 on the liquid cooled module.

Figure 19A:
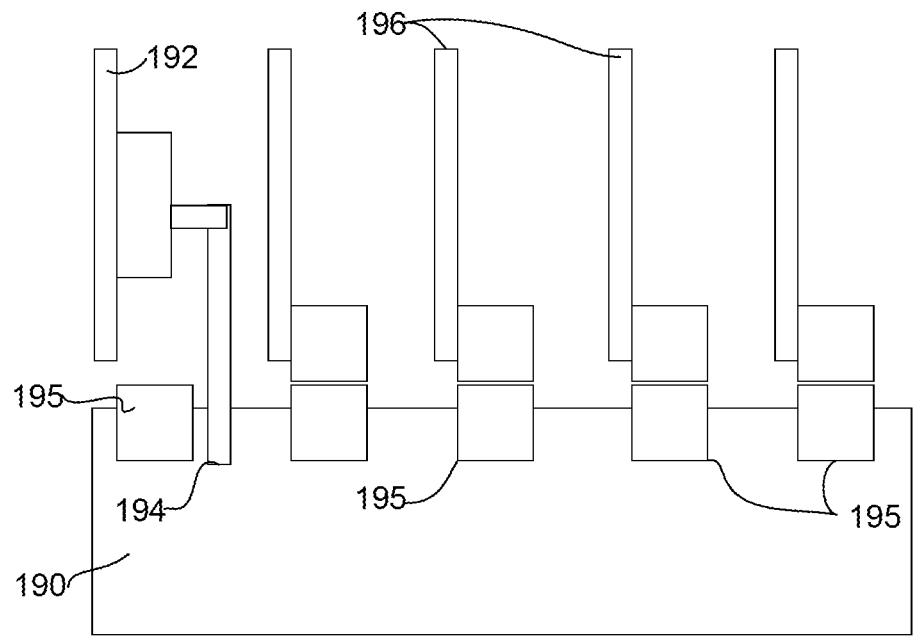
FIG. 19A is a top schematic view showing liquid cooling components of the coolant distribution module offset from an orthogonal connector on an air cooled module, in accordance with one embodiment.
Figure 19B:
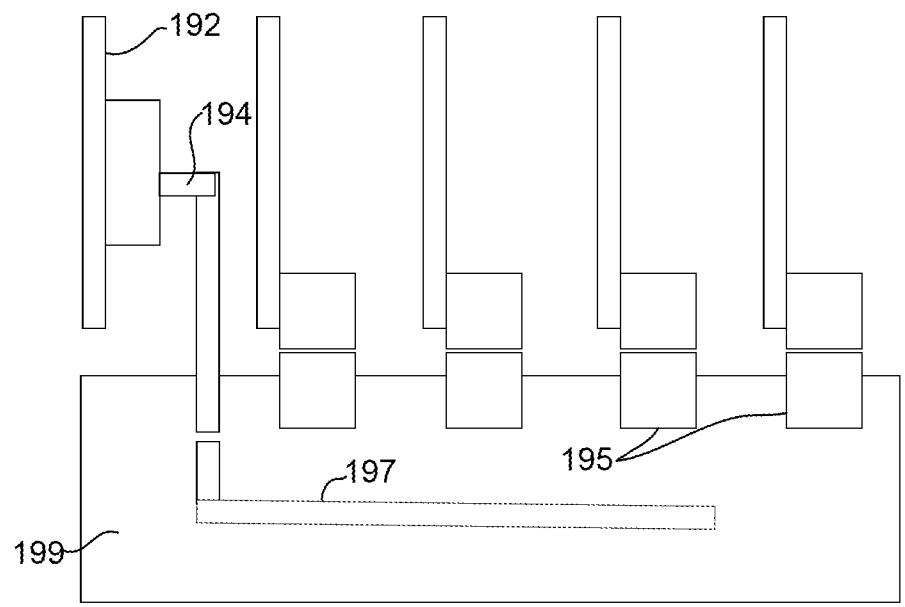
FIG. 19B is a top schematic view showing a connection between the liquid cooling components of the coolant distribution module of FIG. 19A and a liquid cooled module.

FIGS. 19A and 19B illustrate another example in which the coolant line and connector 194 are offset from the orthogonal connector 195, where adequate space is available. This allows the liquid cooling infrastructure to co-exist with the orthogonal chassis without interference and enables cards that support liquid cooling or conventional air cooled cards to interface with the coolant distribution module without risk of damage. FIG. 19A illustrates an air cooled module 190 inserted into a chassis with a vertical coolant distribution module 192 and vertical cards 196. FIG. 19B shows a liquid cooled module 199 with cooling distribution line 197 aligned with distribution line 194 on the vertical coolant distribution module 192.

Figure 20:
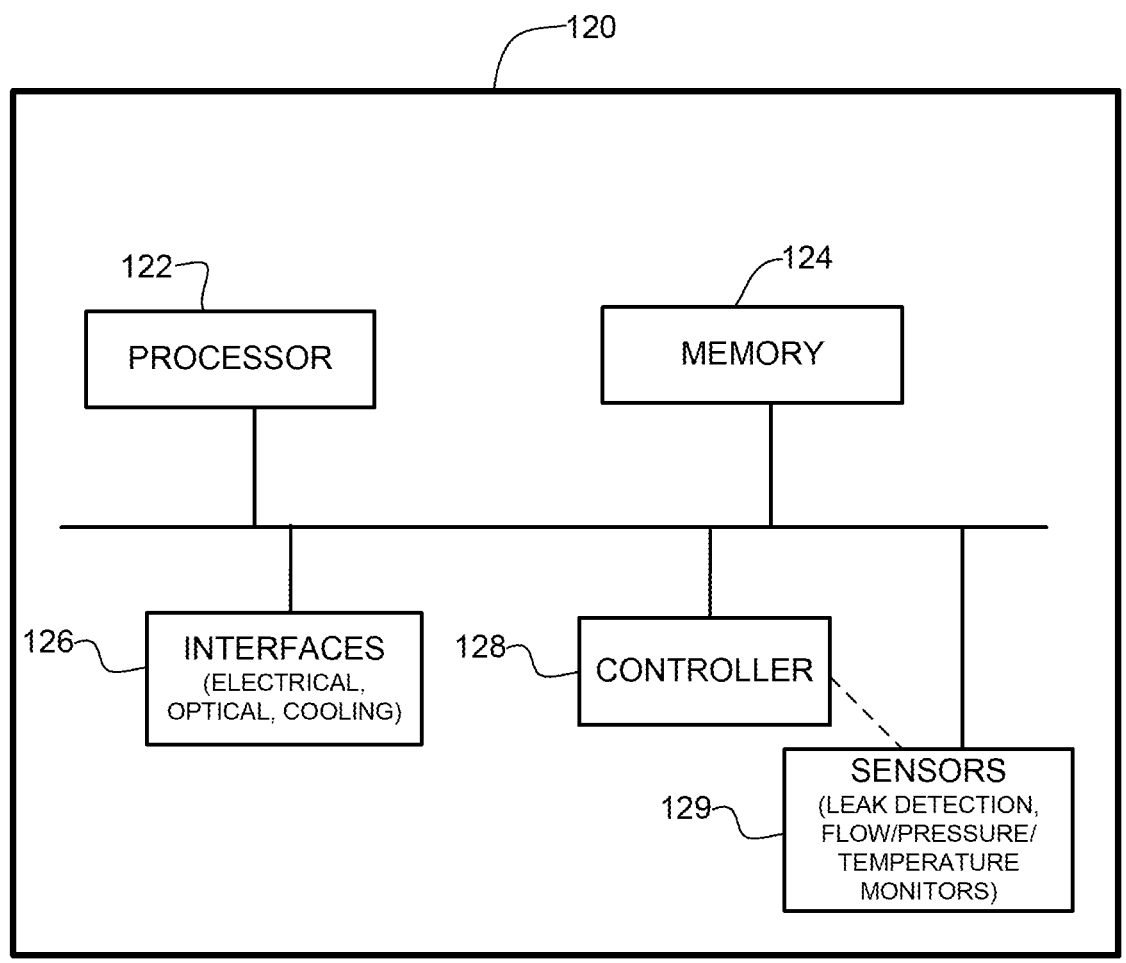
FIG. 20 is a block diagram of a network device in which embodiments described herein may be implemented.

As previously noted, the embodiments described herein may operate in the context of a network device. In one embodiment, the network device is a programmable machine that may be implemented in hardware, software, or any combination thereof. The network device 120 includes one or more processor 122, memory 124, network interfaces (line cards, fabric cards) 126, controller 128, and sensors 129 (FIG. 20). One or more of the components (e.g., processor, memory, interfaces (data, electrical, optical, cooling), sensors) may be located on the line card or fabric card and one or more components may be located on the coolant distribution module (e.g., cooling interfaces)

Memory 124 may be a volatile memory or non-volatile storage, which stores various applications, operating systems, modules, and data for execution and use by the processor 122. The network device 120 may include any number of memory components.

Logic may be encoded in one or more tangible media for execution by the processor 122. For example, the processor 122 may execute codes stored in a computer-readable medium such as memory 124. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The processor 122 may be operable, for example, to perform processes described below with respect to FIGS. 21A, 21B, 24, and 25. The network device 120 may include any number of processors 122.

As described in detail below, the network device 120 may include a controller (control system) 128 operable to electronically control one or more flow control valves for distribution of coolant throughout the chassis, and sensors 129, which may, for example, monitor aggregate and individual branch coolant temperatures, pressures, and flow rate quantities at strategic points around the coolant loop. Temperature sensors may also be used to monitor die temperature of critical semiconductors, temperature of critical components (e.g., optical modules, disk drives), or the air temperature inside a device's sealed enclosure. The controller 128 may receive input from one or more sensors 129 (e.g., leak detector, flow monitor, pressure monitor, temperature monitor) located on one or more line cards, fabric cards, coolant distribution modules, or other location within the chassis. The controller 128 may evaluate thermal conditions of all line cards and fabric cards and coolant temperature, and adjust the coolant flow to maintain a set point temperature. For example, coolant flow may be increased to a zone, line card, fabric card, or component based on an identified increase in temperature, or coolant flow may be reduced based on a decrease in temperature or power usage. Upon identification of a leak in the coolant distribution system, one or more flow control valves may be closed to isolate a portion of the system containing the leak. The controller 128 may be operable to control coolant distribution to one or more coolant distribution modules, group of line cards or fabric cards, individual line cards or fabric cards, group of components on the line card or fabric card, individual components on the line card or fabric card, or zones within the chassis. As described below with respect to FIG. 26, the controller 128 may comprise a plurality of controllers for controlling coolant flow in one or more zones. In one or more embodiments, the controller 128 may also control coolant distribution to more than one chassis.

The system control function may operate using a microcontroller that draws minimal current. When the coolant distribution system is off, the flow control valve is preferably held at zero flow to prevent freezing. When the coolant distribution system is shut off, temperature may be monitored to determine when it is safe to stop coolant flow. While the coolant distribution system is off, the controller 128 may continue to monitor temperature to identify hot spot occurrences and re-initiate flow as needed. When the system is turned on, flow begins and pressure may be verified. The software system may then be enabled. If the electrical system is configured for low power and high power operation, the system may remain in low power operation until the flow, temperature, and pressure of the coolant distribution system is validated.

In one or more embodiments, the controller 128 may use artificial intelligence or machine learning techniques to set or modify system limits (e.g., temperature, pressure) that may change over time or with operating conditions. Machine learning may be used within the control system to compensate for response times between when coolant flow rates change and the component's temperature reacts to the change. As described below, an adaptive temperature control algorithm may be used to adjust flow based on flow response.

In one or more embodiments, the controller 128 may be configured to operate the valves in accordance with a flow valve modulation algorithm (described below with respect to FIG. 25) to prevent valve stiction (i.e., control valve sticking at rest due to the resistance to start of motion (force required to overcome static friction exceeds dynamic friction)) and eliminate valve noise in conducted emissions.

It is to be understood that the network device 120 shown in FIG. 20 and described above is only an example and that the embodiments described herein may be implemented in different configurations of network devices. For example, the network device 120 may further include any suitable combination of hardware, software, algorithms, processors, devices, components, or elements.

FIG. 21A is a flowchart illustrating an overview of a process for distributing coolant in a modular electronic system, in accordance with one embodiment. At step 130, coolant is received at a coolant distribution module (horizontal or vertical adapter card) inserted into a chassis at a first orientation. Coolant is delivered to modules (line cards, fabric cards) inserted into the chassis at a second orientation orthogonal to the first orientation of the coolant distribution module (step 132). Return coolant is received from the modules (step 134) and the warm (or hot) coolant is returned to a heat exchanger (step 136). The coolant flow continues while the network device is operational and coolant is supplied or until the coolant distribution module is removed. As described above with respect to FIG. 3, a second coolant distribution module may be inserted into one of the slots in the second orientation for distributing coolant to at least one of the modules in the first orientation. The same process described above would be repeated to deliver coolant from the second coolant distribution module to one or more modules in the first orientation.

As previously described, quick disconnects are used to allow for OIR (Online Insertion and Removal) of any of the modules (line cards, fabric cards) without disrupting operation of the network device or delivery of coolant to the remaining liquid cooled modules. The coolant distribution system is configured to ensure equal pressure when horizontal or vertical cards are removed and ensure appropriate pressure to avoid condensation with varying card types. The chassis may also include one or more modules (e.g., line cards or fabric cards) that are only air cooled, as previously described.

FIG. 21B is a flowchart illustrating an overview of a process for delivering coolant to at least two cooling loops (cooling zone, cooling section, group of components or modules) through at least two flow control valves. Each cooling loop may deliver coolant to a zone or group of modules (line cards, fabric cards) or components on the line card or fabric card). The term 'cooling loop' as used herein refers to the coolant delivery line or lines (including branches) and thermal control elements through which coolant received from the associated flow control valve flows. As described below with respect to FIG. 26, a coolant distribution system may comprise a single input with multiple zones. In one or more embodiments, a controller is in communication with a plurality of flow control valves to control coolant distribution in a plurality of cooling loops. This allows for cooling flow to be adjusted as needed in each cooling loop.

Referring now to FIG. 21B, coolant is received at the coolant distribution system in the chassis of a network communications device at step 138. Coolant is delivered to a plurality of modules inserted into the chassis through electronically controlled flow control valves (step 140). For example, coolant may be delivered to a first group of the modules with a first flow control valve in a first cooling loop and the coolant delivered to a second group of the modules with a second flow control valve in a second cooling loop. Temperature is monitored in each of the cooling loops (step 142). The controller transmits a signal to at least one of the flow control valves to modify a flow of the coolant (step 144). For example, if there is a temperature increase in one of the cooling loops, the control valve may increase the flow to the cooling loop to reduce the temperature. As described below, pressure and flow may also be monitored and flow adjusted based on weighted tap values for flow response or the flow control valve may be shut off if a leak is detected.

It is to be understood that the processes shown in FIGS. 21A and 21B, and described above are only examples and that steps may be added, combined, modified, or removed, without departing from the scope of the embodiments.

As previously discussed, in one or more embodiments, the chassis may include a leak detection system for use in early detection of a leak (or possible leak) of the coolant so that appropriate steps may be taken to reduce fluid loss or adjust operation of one or more components (e.g., shut off one or more flow control valve, reduce power to electrical components). If the leak is identified as coming from one of the coolant distribution modules, flow to that coolant distribution module may be shut off. If a source of the leak is not identified, a central flow control valve or multiple flow control valves within the chassis may be shut down. In response to the loss of coolant flow, one or more electrical components may also be shut down or power consumption reduced (e.g., change to lower power operation) to prevent overheating and possible damage to the components. As described below, a leak may be detected through monitoring of conditions within the coolant distribution system (e.g., loss of pressure, surge in coolant velocity) or identification of coolant external to the coolant distribution system (e.g., coolant present in leakage collection tray, visual identification of coolant, condensation of coolant, increase in moisture within chassis).

Figure 22:
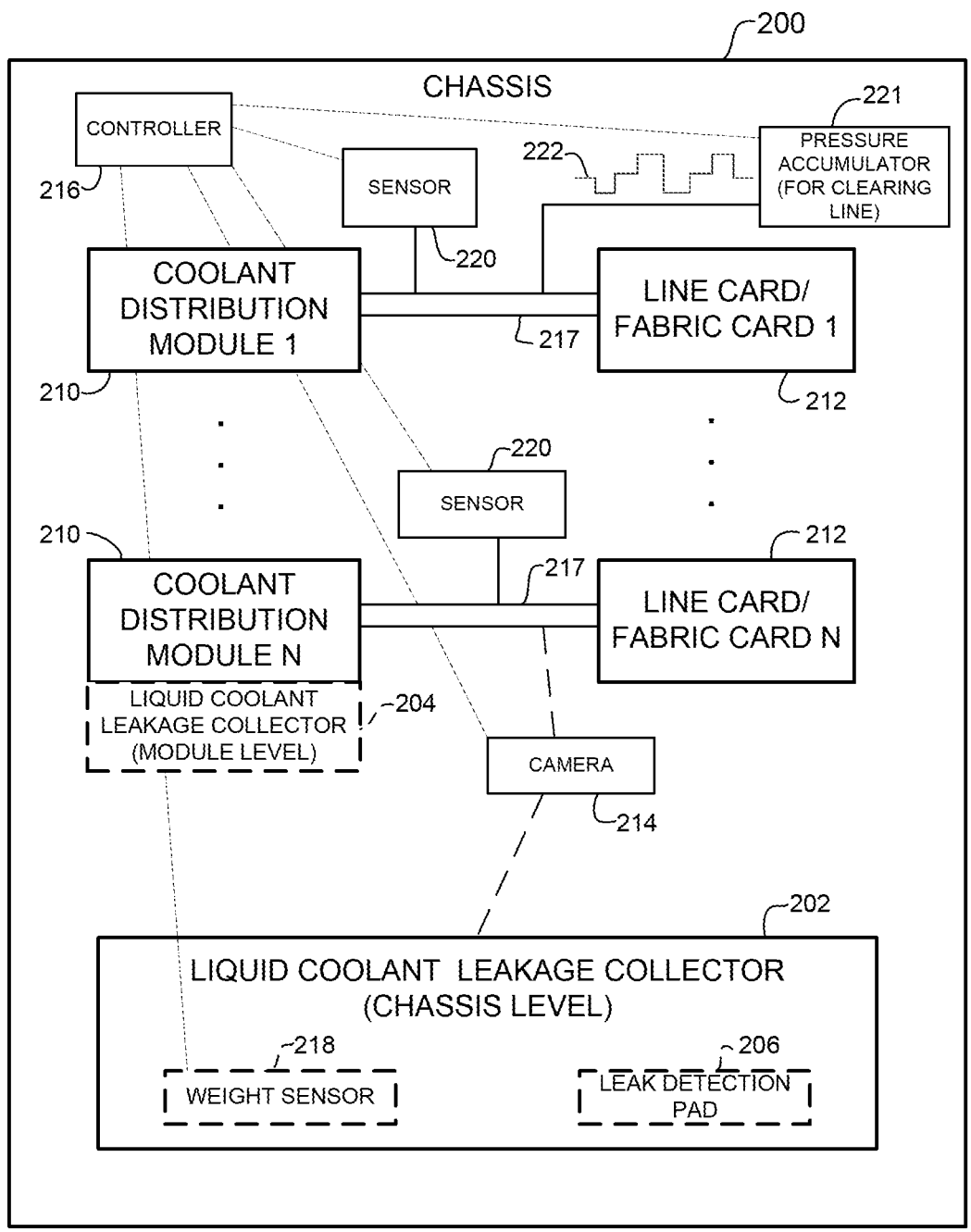
FIG. 22 is a block diagram of a leak detection system, in accordance with one embodiment.
Figure 23:
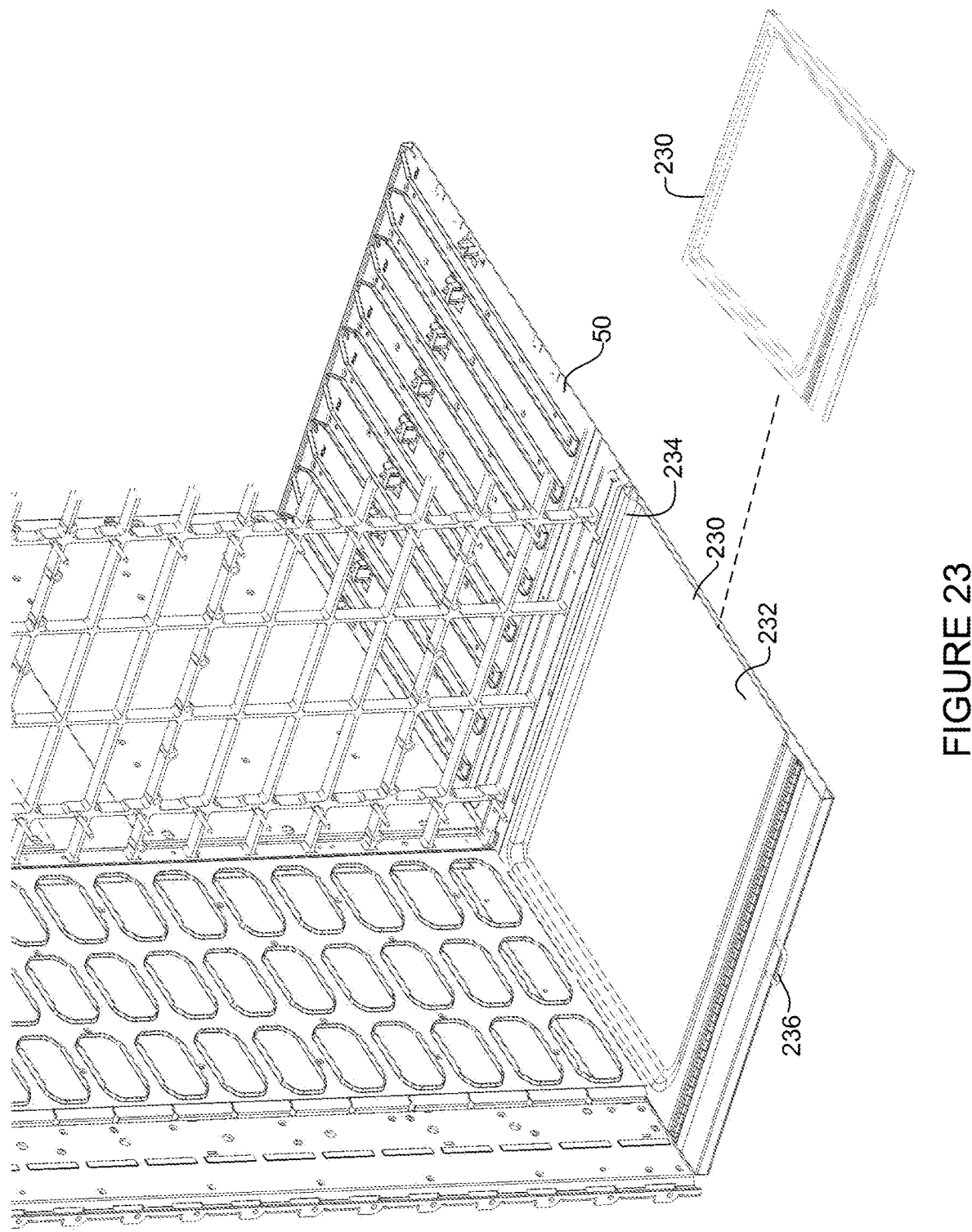
FIG. 23 is a front perspective of the chassis with the coolant distribution modules and a portion of the chassis removed to show details of a coolant leakage collector tray, in accordance with one embodiment.

FIG. 22 is a block diagram illustrating different leak detection systems that may be used to identify a leak within a chassis 200. In one or more embodiments, a liquid coolant leakage collector tray 202, 204 may be positioned within the chassis to collect coolant leakage. The tray 202, 204 may include a sheet or pad 206 of material that changes color upon contact with the coolant. The color changing material may comprise, for example, cobalt chloride or any other suitable chemical that exhibits a change in color upon contact of liquid used in the coolant. The tray may be configured for easy removal from the chassis for visual inspection and replacement of the material (similar to a filter tray), as described below with respect to FIG. 23. The tray 202 may be positioned to identify leakage at the chassis level (e.g., bottom of chassis as shown in FIG. 23) or the tray 204 may be positioned or integrated with one or more coolant distribution modules 210 (1 . . . N). The leakage collector tray may also be positioned to collect leakage from one or more line cards or fabric cards 212 (1 . . . N) or group of line cards or fabric cards.

In one or more embodiments, a weight sensor 218 may be positioned under the liquid coolant leakage collector tray to identify an increase in weight due to collection of coolant in the tray. In another example, the weight sensor 218 may comprise a strain gauge attached to the chassis structure and operable to identify changes in weight within the chassis or a portion of the chassis for use in detecting a leak.

One or more cameras 214 may be positioned to identify a change in color of the pad 206 and transmit a signal to a controller 216 to identify a leak, and in some embodiments, identify a location of the leak in order to isolate the cause of the leak (e.g., under horizontal coolant distribution module or vertical coolant distribution module, or other location within the chassis).

The camera 214 may also be configured to identify a leak based on changes in the coolant flow within the coolant line 217. For example, one or more of the distribution lines 217 may be transparent for use identifying one or more flow patterns or characteristics within the line with a high-speed camera. In one or more embodiments, the liquid coolant may include dye that changes color with temperature so that the color change can be identified by the camera to indicate an increase in temperature. The camera may also be configured to identify condensation or coolant external to the coolant distribution system.

In one or more embodiments, the camera 214 may comprise an infrared camera for identifying thermal changes within the coolant line 217 or one or more modules 212 (line card/fabric card 1 . . . N) or locations within the chassis 200.

As previously described, one or more sensors 220 may be positioned for monitoring coolant flow within the cooling lines 217 or components 212. The sensor 220 may be configured for monitoring temperature, pressure, flow, velocity, or any combination thereof. The sensors 220 may provide input to the controller 216 for use in identifying a possible leak. For example, a sudden or gradual decrease in pressure or increase in velocity may indicate a leak in the line 217 or downstream component 212. The controller 216 may signal a flow control valve to shut off flow in response to the leak, as described below with respect to FIG. 24. The chassis may also include a humidity (moisture) sensor for use in identifying a possible leak.

During times of lower system operating temperature, it may be desired to clean the cooling lines 217 to prevent blockage in critical areas. This may be accomplished, for example, by reverse flow bursts based on a low frequency rate. In one or more embodiments, the system may include a hydraulic accumulator (pressure storage device) 221 for use in reversing flow for a very short period of time to create turbulent flow for use in clearing the line 217 of any build-up or particulate matter. Trace 22 illustrates an example of how flow or pressure turbulence may be created during line clearing. This process may be performed in response to a reduction in flow rate, or periodically or in a random manner as a preventive measure. After the reverse flow line clearing process is performed, the controller 216 may verify an increase in flow rate in the line 217.

It is to be understood that the system shown in FIG. 22 is only an example and changes may be made without departing from the scope of the embodiments. For example, only one of the leak detection methods may be used or any combination of the leak detection methods may be used. Also, the leak detection system described herein may be used with liquid coolant distribution systems that are different than the systems shown and described herein.

Referring now to FIG. 23, an internal portion of the chassis 50 is shown with the coolant distribution modules removed to illustrate details of a leakage collection tray 230 inserted into the chassis (with a separate view of the full tray shown offset to the side). In the example shown in FIG. 23, the tray 230 is positioned to collect coolant leakage in the chassis 50. As previously described, the tray 230 may include a sheet or pad of material that changes color upon contact with coolant, positioned on an upper surface 232 of the tray. The tray 230 may easily be removed from a front of the chassis for visual inspection and replacement of the pad. As shown in FIG. 23, handle 236 may be used to slide the tray in or out of the chassis 50. In another example, a horizontal tray may be positioned below connection points of the horizontal coolant distribution module and a vertical tray positioned to collect coolant leakage at connection points of the vertical coolant distribution module. In one or more embodiments, the tray is sized to hold the entire volume of coolant in at least a portion of the system (e.g., zone or loop of coolant distribution module) to prevent damage to equipment in the chassis. The tray 230 preferably includes a periphery flange or lip 234 to prevent leaked coolant from spilling out of the tray.

As previously described with respect to FIG. 20, one or more controllers may operate to control one or more flow control valves in the coolant distribution system. FIG. 24 is a flowchart illustrating control valve operation in response to changes in monitored pressure or flow, in accordance with one embodiment. The system is started at step 240. A flow control valve (e.g., main flow control, coolant distribution module flow control valve, zone flow control valve) is turned on at step 241. Pressure 242 and flow 243 are monitored at steps 244 and 245, respectively. If no change is identified, the monitoring continues. If a change in pressure or a change in flow is identified (steps 244, 245) and a switch in the position of the valve was initiated (command received) (step 246), no action is taken. If a change in pressure or flow is identified and a switch in the position of the flow control valve was not initiated, an alarm is set (step 247) (e.g., minor or major alarm). If the pressure or flow reaches a specified limit, flow is shut off at the valve (critical alarm) (step 248). Another sensor (e.g., in leakage detection system) may initiate an emergency stop (step 249), which also results in the flow being shut off (step 248).

Figure 25:
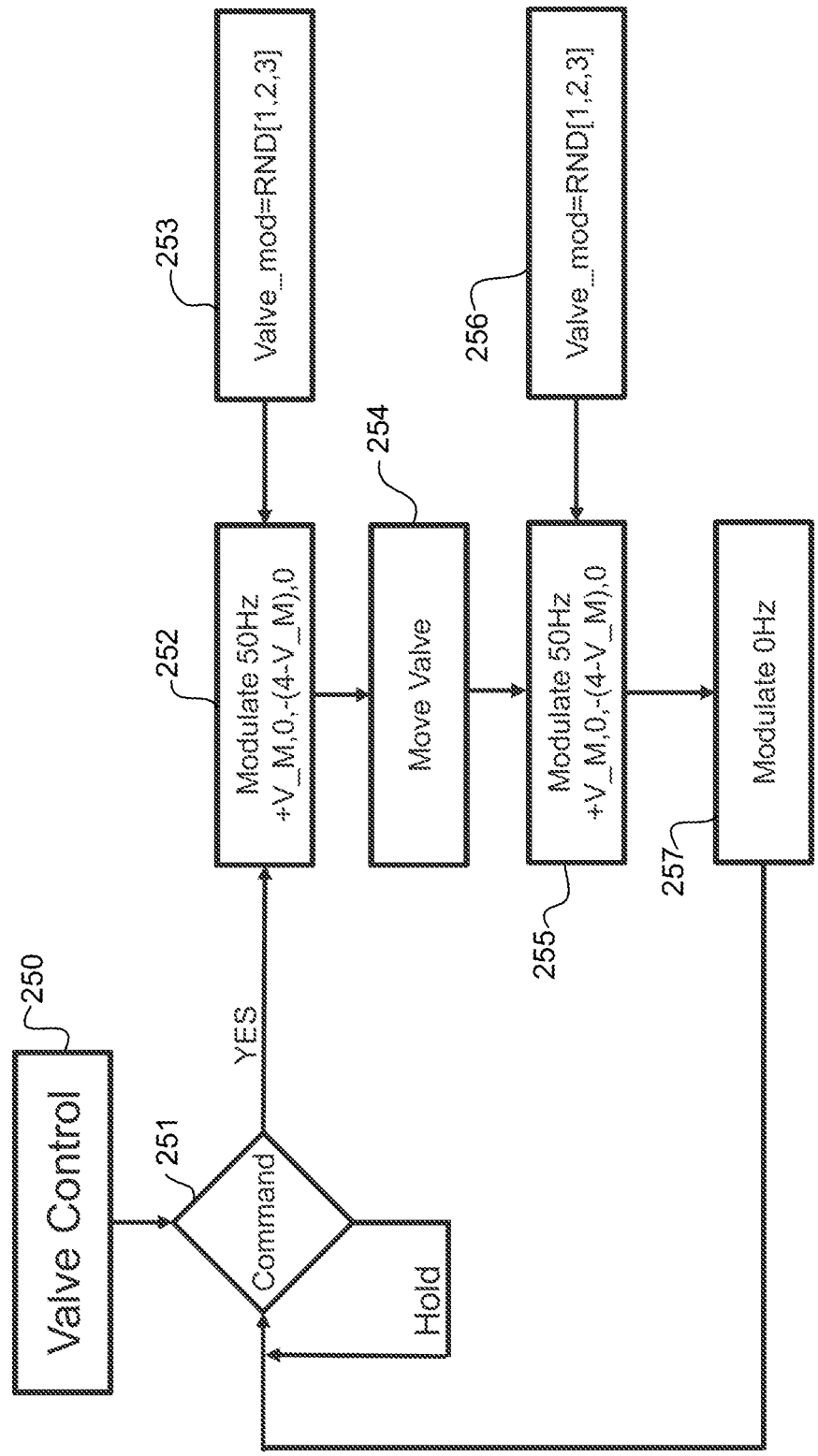
FIG. 25 of a flowchart illustrating flow valve modulation, in accordance with one embodiment.

FIG. 25 illustrates an example of a flow valve modulation process, in accordance with one embodiment. As previously described, coolant delivery is controlled at one or more electronically controlled flow control valves (servo valves). In order to prevent stiction, minimize mechanical resonance, and eliminate (or reduce) noise in conducted emissions, the valve is modulated upon receiving a command before moving the valve in response to the command.

As shown in the flowchart of FIG. 25, valve control is initiated at 250. If the valve position is held in place (no move command received), no action is taken. If a command to move the valve is received at step 251 (e.g., increase flow, decrease flow, stop flow, start flow), a flow valve modulation algorithm is initiated (step 252). In this example, the current valve position is zero and it is modulated between two or more positions (e.g., +V_M, 0, −(4−V_M), 0). In one example, the valve modulation is based on a random selection (step 253) and the modulation may be performed a random number of times. The valve is then moved to its commanded position (step 254). The valve may be optionally modulated after it is moved (steps 255 and 256). The modulation is then stopped (step 257) and the process continues. In order to prevent valve wear or fluid flow issues, the flow valve modulation may be performed only before or after a valve command.

Figure 24:
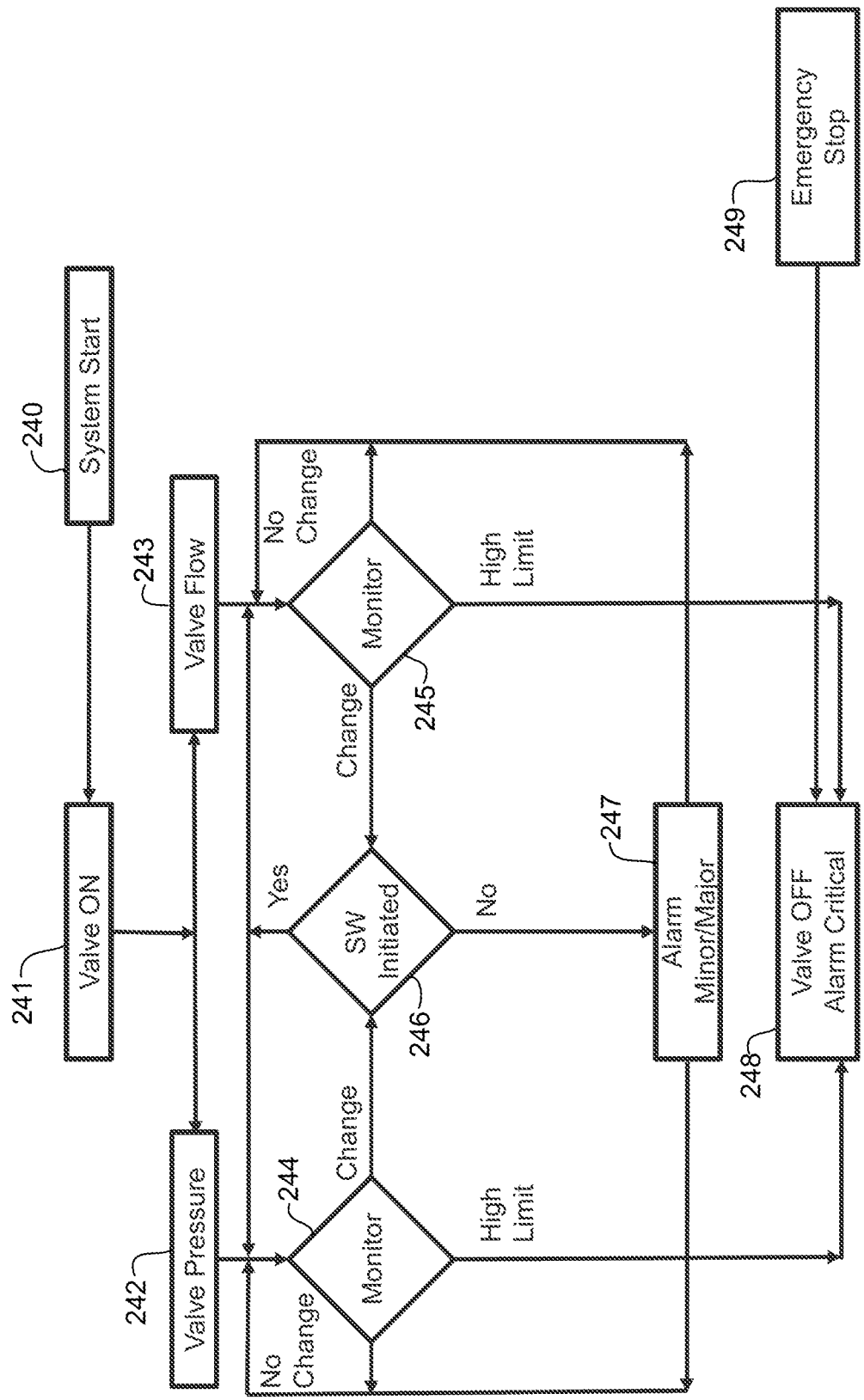
FIG. 24 is a flowchart illustrating a valve control process, in accordance with one embodiment.

It is to be understood that the processes shown in FIGS. 24 and 25 and described above are only examples and steps may be added, removed, combined, or modified without departing from the scope of the embodiments.

As previously described, flow monitoring and control may be performed at a system level (e.g., chassis level), component level, or at different zones (e.g., groups of line cards, fabric cards, or components), with one or more zones broken down into additional zones. FIG. 26 is a block diagram illustrating an example of a dual zone manifold 260 with a single input connection. The system includes a single flow input (Flow In) and a single flow output (Return) (Flow Out) 264. Monitoring and control is separated into two or more zones (Zone 1, Zone 2 (Zone 2/1, Zone 2/2, Zone 2/N)) (cooling loops). A flow control valve with a check valve 261 is located at the flow inlet and is in communication with system controller 262. Each zone (Zone 1, Zone 2) may also include a check valve 263, 265 for fluid isolation between the zones. Each zone also includes a pressure maintainer (Pressure Maintainer 1, Pressure Maintainer 2) 266 (e.g., for absorbing volume changes to provide a constant load) and monitor (e.g., pressure monitor) 267. Zone 2 is further broken down into additional zones (2/1, 2/2, 2/N), which include individual monitors (e.g., pressure, flow monitor) 268 and flow control valves 269 coupled to a zone controller 270 (for control of Zone 2).

Figure 26:
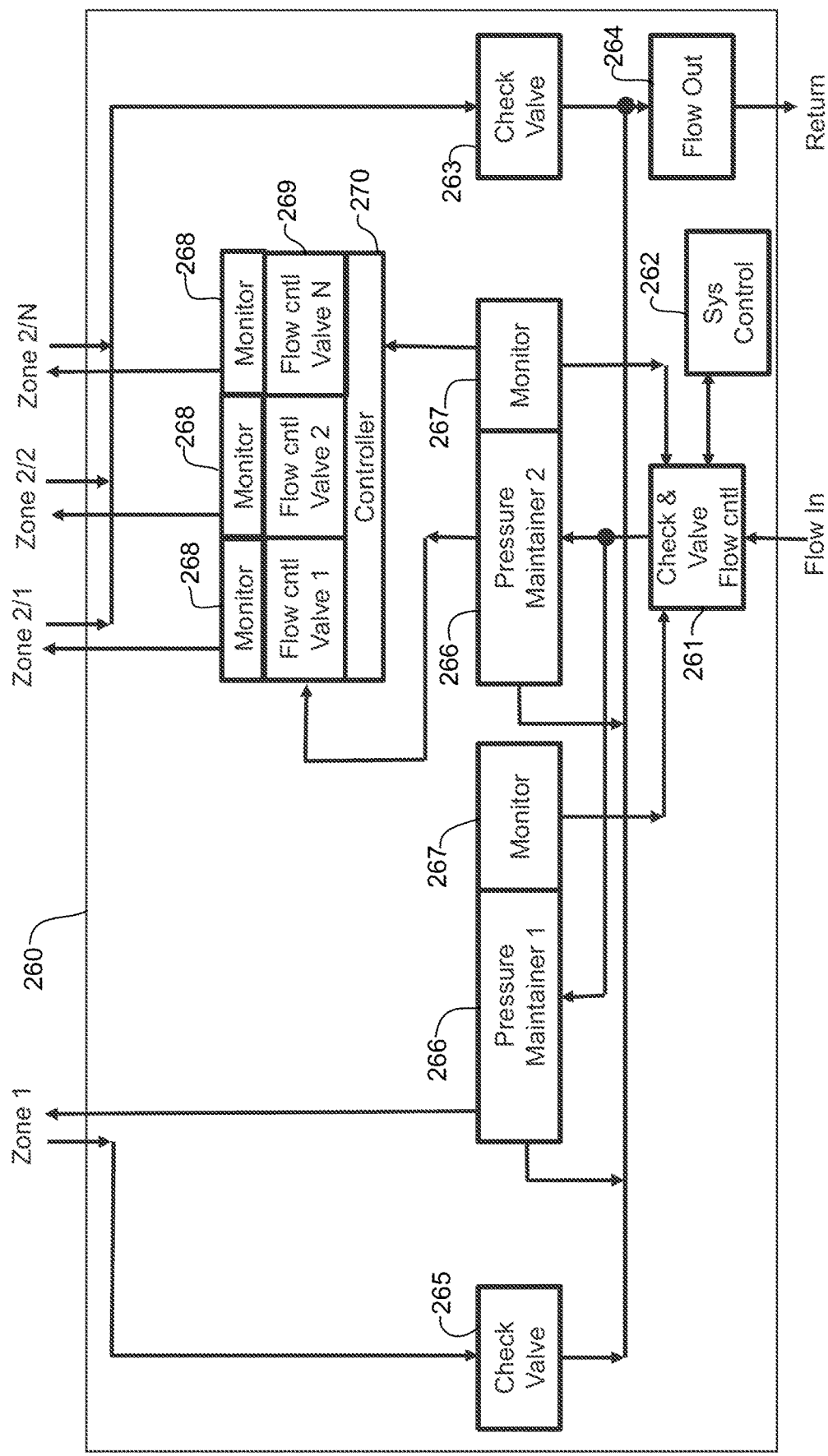
FIG. 26 is a block diagram illustrating a multiple zone manifold with flow control components, in accordance with one embodiment.

It is to be understood that the block diagram shown in FIG. 26 is a simplified example illustrating control with multiple coolant distribution zones. The coolant distribution system may include any number of individually controlled zones with any number or arrangement of fluid components.

In one or more embodiments, the system may be configured for adaptive temperature control. In one example, an adaptive temperature control algorithm may be used to adjust flow based on a multi-tap filter response that takes into account temperature (T), change in temperature (d(T)), differential temperature (d^2(T)), pressure (P), change in pressure (d(P)), differential pressure (d^2(P)), or any combination thereof. The following is an example of a flow control algorithm using weights (w):

$$Flow[1-Valve\_modulation]*[w(t1)*sum[w(t2)*T+w(t3)*d(T)+w(t4)*d^2(T)]+sum[w(t5)*sum[w(t6)*P+w(t7)*d(P)+w(t8)*d^2(P)]]]$$

In the above equation w(x) are weighted tap values for flow response based on run time pre-emphasis. Weighting values may change based on operating status (e.g., startup (off to on, warm to on) and active on demand. It is to be understood that the above equation is only an example and other equations with various weighting values may be used.

It is to be understood that the flow valve modulation, control system, and adaptive temperature control described above are only examples and changes may be made without departing from the scope of the embodiments. Also, the flow valve modulation, control system, and adaptive temperature control may be implemented in coolant distribution systems different than described herein.

Although the method and apparatus have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
a chassis comprising a plurality of slots for receiving a plurality of modules, a first group of the modules received in a first orientation and a second group of the modules received in a second orientation orthogonal to said first orientation; and
a coolant distribution module inserted into one of said plurality of slots in said first orientation for distributing coolant to at least one of the modules in said second group of the modules, the coolant distribution module comprising a first connector for receiving the coolant and a second connector for mating with the module receiving the coolant;
a second coolant distribution module inserted into one of said plurality of slots in said second orientation for distributing coolant to at least one of the modules in said first group of the modules, and a control system for controlling delivery of the coolant to said first and second coolant distribution modules.

2. The apparatus of claim 1 further comprising a leak detection system for indicating a leak of the coolant.

3. The apparatus of claim 2 wherein the leak detection system comprises a pressure sensor for detecting a change in pressure in a coolant loop.

4. The apparatus of claim 2 wherein the leak detection system comprises a velocity sensor for detecting a change in speed of the coolant in a coolant loop.

5. The apparatus of claim 2 wherein the leak detection system comprises a camera for use in identifying the leak.

6. The apparatus of claim 2 wherein the leak detection system comprises a tray for collecting the coolant from the leak, the tray comprising a material configured to change color upon contact with the coolant.

7. The apparatus of claim 2 wherein the leak detection system comprises a weight sensor for use in identifying collection of leaked coolant.

8. The apparatus of claim 2 further comprising a controller for receiving an indication of the leak from the leak detection system and transmitting a signal to a control valve to shut off flow of the coolant.

9. A network communications device comprising:
a chassis;
two groups of modules removably inserted into a plurality of slots in the chassis, at least a portion of the modules each comprising a connector for receiving coolant for cooling components on the modules;
two coolant distribution modules inserted into the chassis for distributing coolant to the two groups of modules, each of the coolant distribution modules inserted in a different orientation relative to the other of the coolant distribution modules;
a control system for controlling delivery of the coolant to the two coolant distribution modules; and
a leak detection system for identifying a leak of the coolant and transmitting an indication of the leak to the control system.

10. The network communications device of claim 9 wherein the leak detection system comprises a pressure sensor for detecting a change in pressure in a coolant loop.

11. The network communications device of claim 9 wherein the leak detection comprises a velocity sensor for detecting a change in speed of the coolant in a coolant loop.

12. The network communications device of claim 9 wherein the leak detection system comprises a camera for use in identifying the leak.

13. The network communications device of claim 9 wherein the leak detection system comprises a tray for collecting the coolant from the leak, the tray comprising a material configured to change color upon contact with the coolant.

14. The network communications device of claim 9 wherein the leak detection system comprises a weight sensor for use in identifying leakage of the coolant.

15. The network communications device of claim 9 further comprising a pressure accumulator operable to reverse flow of the coolant for clearing a line delivering the coolant.

16. The network communications device of claim 9 wherein the control system is operable to reduce power consumption at one or more of the components to prevent overheating in response to the indication of the leak.

17. The network communications device of claim 9 wherein the control system is operable to utilize an adaptive temperature control algorithm to adjust flow based on a multi-tap filter response that takes into account one or more of temperature, change in temperature, differential temperature, pressure, change in pressure, or differential pressure.

* * * * *